(12) United States Patent
Gandhi et al.

(10) Patent No.: US 12,027,493 B2
(45) Date of Patent: Jul. 2, 2024

(54) FANOUT INTEGRATION FOR STACKED SILICON PACKAGE ASSEMBLY

(71) Applicant: XILINX, INC., San Jose, CA (US)

(72) Inventors: Jaspreet Singh Gandhi, San Jose, CA (US); Suresh Ramalingam, Fremont, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/672,802

(22) Filed: Nov. 4, 2019

(65) Prior Publication Data
US 2021/0134757 A1    May 6, 2021

(51) Int. Cl.
| | |
|---|---|
| *H01L 25/065* | (2023.01) |
| *H01L 21/56* | (2006.01) |
| *H01L 21/60* | (2006.01) |
| *H01L 23/00* | (2006.01) |

(52) U.S. Cl.
CPC ........ *H01L 25/0655* (2013.01); *H01L 21/565* (2013.01); *H01L 24/05* (2013.01); *H01L 2021/60007* (2013.01); *H01L 2224/02371* (2013.01); *H01L 2224/02372* (2013.01)

(58) Field of Classification Search
CPC .... H01L 25/0655; H01L 21/565; H01L 24/05
USPC ....................................................... 257/686
See application file for complete search history.

(56) References Cited

U.S. PATENT DOCUMENTS

| | | | | |
|---|---|---|---|---|
| 4,649,990 | A * | 3/1987 | Kurihara | ............. H01L 23/3731 165/185 |
| 2002/0074146 | A1* | 6/2002 | Okubora | ................. H01L 24/13 174/521 |
| 2002/0155640 | A1* | 10/2002 | Wu | ...................... H01L 23/3677 438/122 |
| 2004/0212096 | A1* | 10/2004 | Wang | .................. H01L 23/3128 257/777 |

(Continued)

FOREIGN PATENT DOCUMENTS

| | | | |
|---|---|---|---|
| CN | 103887256 | * | 6/2014 |
| CN | 109390239 | * | 2/2019 |

(Continued)

OTHER PUBLICATIONS

Unpublished U.S. Appl. No. 16/147,286, filed Sep. 28, 2018, Entitled: "Stacked Silicon Package Assembly Having Thermal Management".

(Continued)

*Primary Examiner* — Sheng-Bai Zhu
(74) *Attorney, Agent, or Firm* — Patterson + Sheridan, LLP

(57) ABSTRACT

A chip package assembly and method for fabricating the same are provided which utilize a plurality of posts in mold compound for improved resistance to delamination. In one example, a chip package assembly is provided that includes a first integrated circuit (IC) die, a substrate, a redistribution layer, a mold compound and a plurality of posts. The redistribution layer provides electrical connections between circuitry of the first IC die and circuitry of the substrate. The (Continued)

mold compound is disposed in contact with the first IC die and spaced from the substrate by the redistribution layer. The plurality of posts are disposed in the mold compound and are laterally spaced from the first IC die. The plurality of posts are not electrically connected to the circuitry of the first IC die.

22 Claims, 15 Drawing Sheets

(56) References Cited

U.S. PATENT DOCUMENTS

| | | | | |
|---|---|---|---|---|
| 2006/0292741 | A1* | 12/2006 | Tseng | H01L 24/97 438/106 |
| 2008/0084725 | A1* | 4/2008 | Lahtinen | H01L 25/18 365/51 |
| 2009/0194852 | A1* | 8/2009 | Chiu | H01L 23/552 257/660 |
| 2011/0175210 | A1* | 7/2011 | Yao | H01L 21/78 257/659 |
| 2013/0221493 | A1* | 8/2013 | Kim | H01L 23/481 257/620 |
| 2014/0124907 | A1* | 5/2014 | Park | H01L 25/105 257/659 |
| 2014/0185248 | A1* | 7/2014 | Mizushiro | H01L 23/48 361/728 |
| 2016/0218317 | A1* | 7/2016 | Hong | H01L 27/3258 |
| 2017/0025342 | A1* | 1/2017 | Tseng | H01L 23/3128 |
| 2017/0365581 | A1* | 12/2017 | Yu | H01L 25/50 |
| 2018/0182701 | A1* | 6/2018 | Imafuji | H01L 24/17 |
| 2018/0211925 | A1* | 7/2018 | Tsai | H01L 21/563 |
| 2020/0161210 | A1* | 5/2020 | Dadvand | C23C 18/54 |
| 2020/0168566 | A1* | 5/2020 | Tsai | H01L 25/16 |

FOREIGN PATENT DOCUMENTS

| | | | |
|---|---|---|---|
| FR | 2910701 | * | 6/2008 |
| JP | H08306745 | * | 11/1996 |
| JP | 2016154161 | * | 8/2016 |
| KR | 20100083363 | * | 7/2010 |
| TW | 201810554 A | | 3/2018 |
| TW | 201926586 A | | 7/2019 |

OTHER PUBLICATIONS

Office Action from Taiwanese Patent Application No. 109137264 dated Feb. 19, 2024.

* cited by examiner

FANOUT INTEGRATION FOR STACKED SILICON PACKAGE ASSEMBLY

TECHNICAL FIELD

Embodiments of the present invention generally relate to a chip package assembly, and in particular, to a chip package assembly comprising a plurality of posts disposed mold compound, the posts laterally spaced from at least one integrated circuit (IC) die, the posts configured to reduce the potential of mold compound delamination or cracking during fabrication of the chip package assembly.

BACKGROUND

Electronic devices, such as tablets, computers, copiers, digital cameras, smart phones, control systems and automated teller machines, among others, often employ electronic components which leverage chip package assemblies for increased functionality and higher component density. Conventional chip packaging schemes often utilize a package substrate, often in conjunction with a through-silicon-via (TSV) interposer substrate, to enable a plurality of integrated circuit (IC) dies to be mounted to a single package substrate. The IC dies may include memory, logic or other IC devices.

In many next generation chip package assemblies, a fanout, such as a redistribution layer, is utilized to connect IC dies to a substrate to which the IC dies are mounted. The IC dies are typically disposed in a mold compound to provide improved structural integrity to the chip package assembly. However, cracks in the mold compound and/or delamination of the mold compound from the IC dies often propagate into the fanout, which may cause conductors (i.e., electrical traces) within the fanout to break or become damaged. Broken and/or damaged conductors within the fanout can result in diminished performance, service life and even device failure.

Therefore, a need exists for a chip package assembly having improved resistance to damage and/or breakage of conductors within a fanout disposed between an IC die and the substrate to which the IC die is mounted.

SUMMARY

A chip package assembly and method for fabricating the same are provided that inhibit damage and/or breakage of conductor within a fanout (i.e., a redistribution layer) disposed between at least one integrated circuit (IC) die and an underlying substrate, such as an interposer substrate or package substrate. Robust protection of the fanout is provided in one example by utilizing a grindless process to produce coplanar contacts across neighboring dies prior to fabrication of a redistribution layer on the contacts. In another example, a plurality of posts in mold compound are utilized to inhibit delamination and/or cracking of the mold compound, thus reducing the probability of such defects from propagating from the mold compound into the redistribution layer where such defects could damage and/or break conductors within the redistribution layer.

In one example, a chip package assembly is provided that includes a first integrated circuit (IC) die, a substrate, a redistribution layer, a mold compound and a plurality of posts. The redistribution layer provides electrical connections between circuitry of the first IC die and circuitry of the substrate. The mold compound is disposed in contact with the first IC die and spaced from the substrate by the redistribution layer. The plurality of posts are disposed in the mold compound and are laterally spaced from the first IC die. The plurality of posts are not electrically connected to the circuitry of the first IC die.

In another example, a chip package assembly is provided that includes a first integrated circuit (IC) die, a second integrated circuit (IC) die, a substrate, a redistribution layer, a mold compound and a plurality of posts. The redistribution layer has circuitry electrically coupled to circuitry of the substrate via solder connections. The mold compound is disposed in contact with the first IC die and is spaced from the substrate by the redistribution layer. The first plurality of posts are disposed in the mold compound between the first IC and the second IC. The first plurality of posts are spaced from the substrate by the redistribution layer.

In another example, a method for fabricating a chip package assembly is provided that includes: mounting a first integrated circuit (IC) die to a carrier; mounting a second IC die to the carrier; filling a gap formed between the first IC die and second IC with a mold compound, the mold compound disposed around a first post disposed in the gap; removing a portion of the mold compound to expose electrical contacts of the first IC die and the second IC; and forming a redistribution layer on the mold compound and first and second IC dies, the redistribution layer having circuitry electrically connected to circuitry of the first and second IC dies.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

Figure 1:
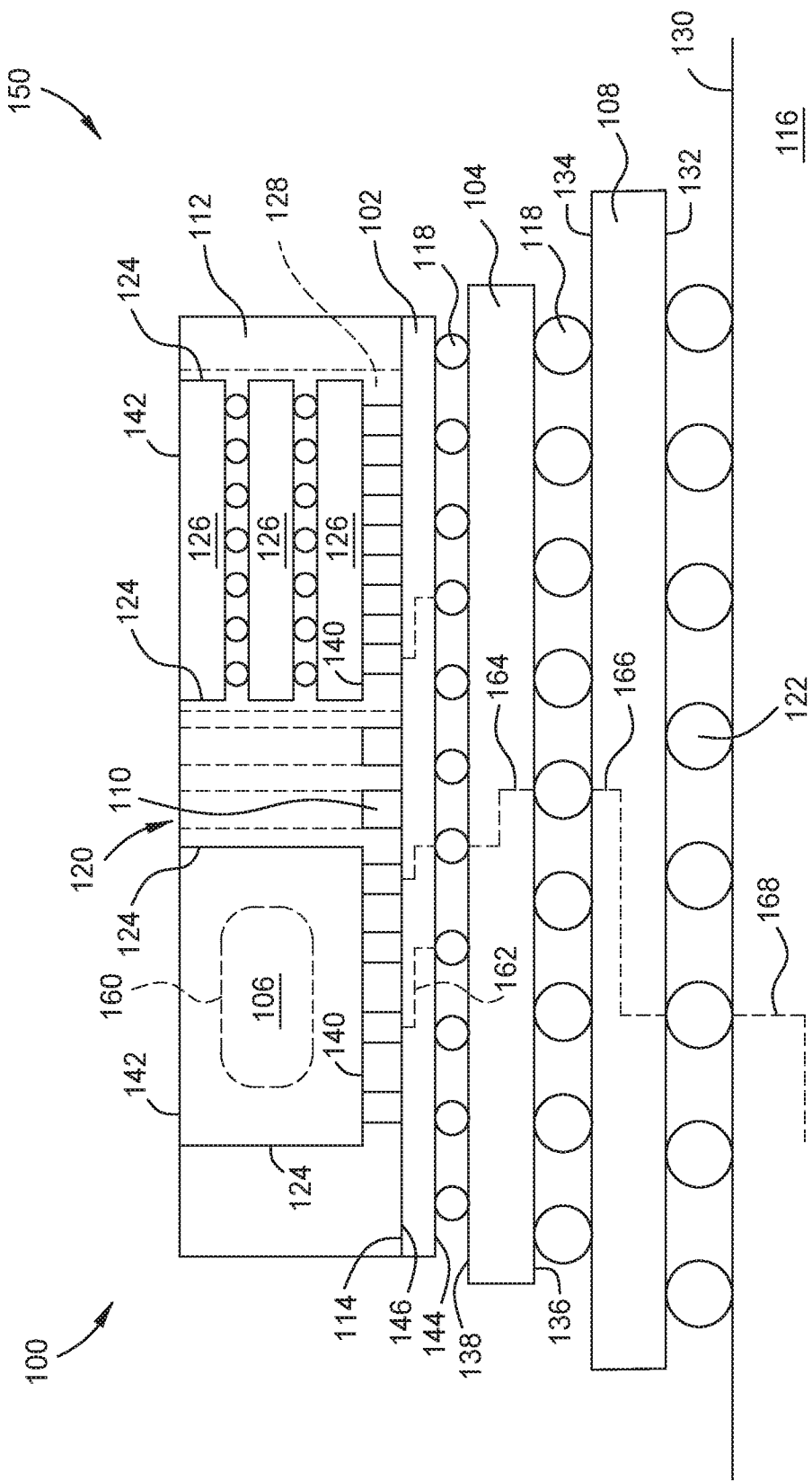
FIG. 1 is a schematic sectional view of the chip package assembly having a plurality of posts disposed around integrated circuit (IC) dies.

A chip package assembly and method for fabricating the same are provided inhibit damage and/or breakage of conductor within a fanout (referred interchangeably as a "redistribution layer") disposed between at least one integrated circuit (IC) die and an underlying substrate, such as an interposer substrate or package substrate. In one example, a grindless process is utilized to produce coplanar contact pads on neighboring IC dies without grinding the conductive pillars extending from the IC dies and mold compound. Since grinding is a common cause of crack generation and delamination in the mold compound, elimination of grinding operation in some examples greatly enhances the probability of such defects in the mold compound, and consequently, substantially reduces the probability of such defect causing a crack to propagate into the fanout where a conductor may be damaged or broken. In other examples, a plurality of posts to disposed in the mold compound that circumscribes at least one integrated circuit (IC) die are utilized to inhibit crack generation in and delamination of the mold compound, even in processes where grinding is utilized to expose the contact pads of the IC dies.

The chip package assembly described herein includes at least one integrated circuit (IC) die disposed in a mold compound and mounted on a substrate. A redistribution layer is disposed between the IC die and substrate. The redistribution layer is electrically and mechanically coupled to the substrate via solder connections. The redistribution layer provides the signal, ground and power transmission paths (i.e., circuitry) between the IC die and substrate. The substrate may be a package substrate or an interposer substrate. The posts, when utilized, do not extend through and are laterally outward of the IC die. The posts significantly improve the mechanical properties of the mold compound, greatly improving the resistance of the mold compound to cracking or delamination (i.e., peeling away) from the IC die during removal of a portion of the mold compound to expose the contact pads or conductors of the IC die for electrical connection to the circuitry of the fanout fabricated in the redistribution layer. Since the mold compound as described above is less prone or likely to crack or delaminate, such defects are significantly less likely to propagate into the redistribution layer where one or more routings of the redistribution layer may be compromised, leading to reduced performance and even failure of the chip package assembly.

Other examples and techniques for preventing damage to the circuitry of the fanout fabricated in the redistribution layer are disclosed herein that alternatively do not utilize posts within the mold compound. These techniques take advantage of etching recesses in the mold compound to expose the die contact pads. Dielectric material is then patterned over the mold compound while still exposing the die contact pads. Conductive material is deposited into the recess, and connects with the exposed contact pads of the IC dies. The conductive material is made coplanar with the bottom surface of the dielectric material such that the redistribution layer maybe directly fabricated without grinding or other mechanical stress induced in the polymer materials disposed adjacent the redistribution layer. As a result, defects in the polymer materials disposed adjacent the redistribution layer are significantly less likely to propagate into the redistribution layer where one or more routings of the redistribution layer may be compromised, leading to reduced performance and even failure of the chip package assembly.

Consequently, the enhanced resistance of the mold compound and other polymer layers adjacent to the redistribution layer to cracking and/or delamination greatly improves the prevention of crack propagation into the fanout which would cause damage or breakage of conductors within the fanout. Consequently, reliability and performance of the chip packages assembly is significantly improved.

Turning now to FIG. 1, a schematic sectional view of a chip package assembly 100 having a plurality of posts 110 disposed in a mold compound 112 adjacent integrated circuit (IC) dies 106, 126 is schematically illustrated. The chip package assembly 100 also includes a redistribution layer (RDL) 102, an interposer substrate 104 and a package substrate 108. The redistribution layer 102 is disposed between the IC dies 106 and an interposer substrate 104, and is also in contact with the mold compound 112.

Although two IC dies 106, 126 are shown laterally spaced from each other in FIG. 1, the total number of IC dies may range from one to as many as can be fit within the chip package assembly 100. Additionally, although a single IC die 106 is illustrated in FIG. 1, the IC DIE 106 may be the bottom die of a stack of IC dies. Furthermore, although IC dies 126 illustrated in FIG. 1 are shown as a stack of IC dies 126, alternatively, the stack of IC dies 126 may be replaced by a single IC die 126. Examples of IC dies 106, 126 that may be utilized in the chip package assembly 100 include, but are not limited to, programmable logic devices, such as field programmable gate arrays (FPGA), memory devices, such as high band-width memory (HBM), optical devices, processors or other IC logic structures. One or more of the IC dies 106 may optionally include optical devices such as photo-detectors, lasers, optical sources, and the like. In the example of FIG. 1, the IC die 106 is a logic die while the IC dies 126 is a plurality of memory dies stacked on a buffer die. The stack of IC dies 126 may be encapsulated in a polymeric overmold compound 128.

In the example depicted in FIG. 1, the chip package assembly 100 is configured as a high band-width memory (HBM) device, with the IC die 106 configured as a logic die, such as a field programmable gate array (FPGA), and IC dies 126 configured as HBM stack of dies. It is contemplated that the IC dies 106, 126 comprising the chip package assembly 100 may be the same or different types, including types other than HBM and FPGA dies.

Each IC die 106, 126 include a bottom surface 140 and a top surface 142. The bottom surface 140 of the IC die 106 is coupled to a top surface 146 of the redistribution layer 102. The bottom surface 140 of the bottommost IC die 126 is also coupled to the top surface 146 of the redistribution layer 102. A bottom surface 144 of the redistribution layer 102 is coupled to a top surface 138 of interposer substrate 104 by solder connections 118 or other suitable electrical connection. An optional cover (not shown) maybe disposed over the top surface 142 of the IC dies 106, 126. When a cover or other heat sink is present over the IC dies 106, 126, thermal interface material (TIM) may be disposed between the top surface 142 of the IC dies 106, 126 and the bottom surface of the cover to enhance heat transfer therebetween. In one example, the TIM may be a thermal gel or thermal epoxy, such as, packaging component attach adhesives. In some implementations, a separate heat sink may be disposed over and in contact with the cover.

Additionally, an optional stiffener (not shown) may be utilized to enhance the rigidity of the chip package assembly 100. The stiffener, when used, may be made of ceramic, metal or other various inorganic materials, and be coupled to one of the interposer substrate 104 or the package substrate 108.

As discussed above, circuitry of the IC dies 106, 126 are connected to circuitry of the redistribution layer 102. Details of the connection between the IC dies 106, 126 and the redistribution layer 102 are further detailed in FIG. 2. The redistribution layer 102 is also in contact with a bottom surface 114 of the mold compound 112.

Figure 2:
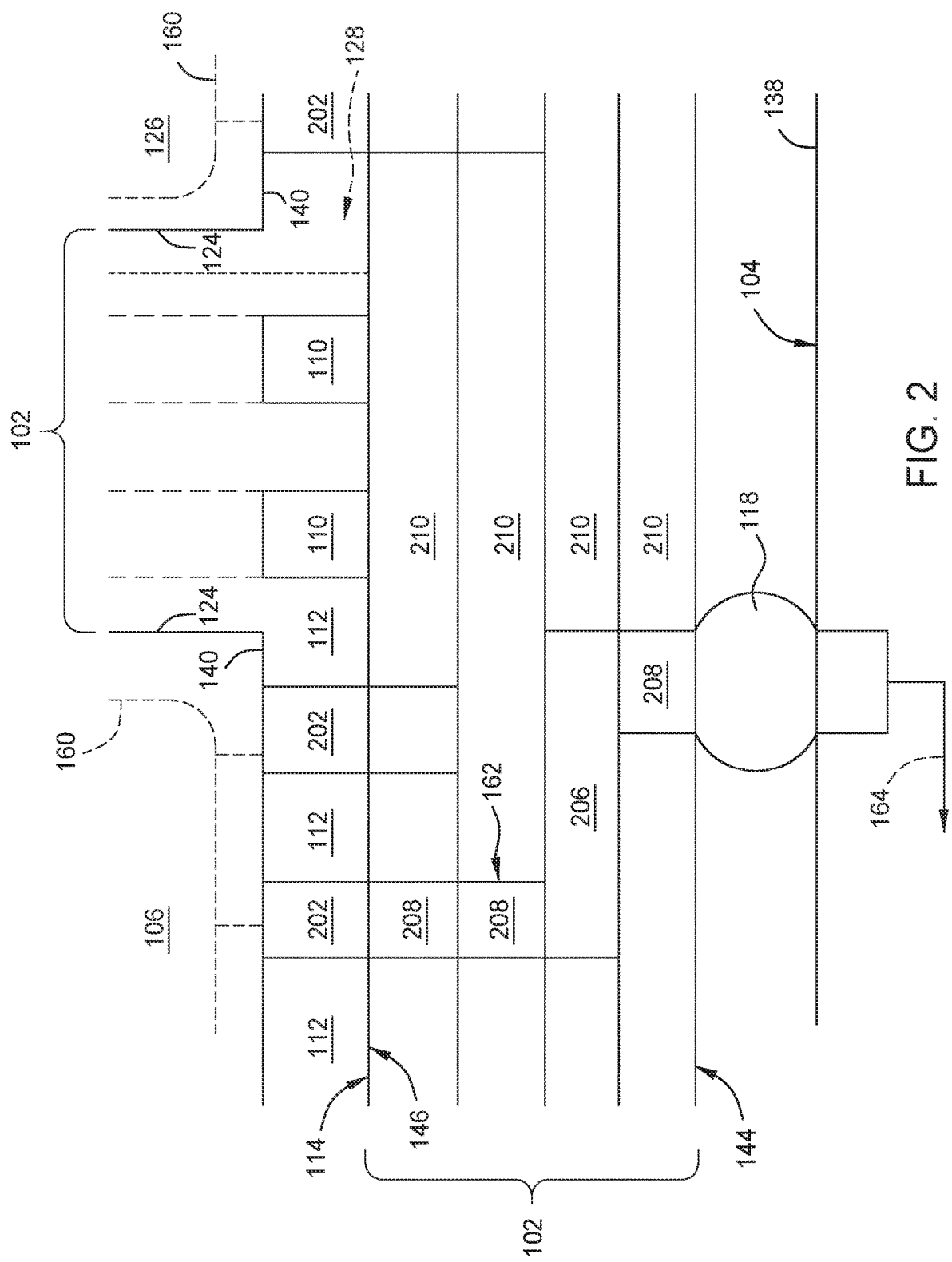
FIG. 2 is a partial sectional view of the chip package assembly of FIG. 1 illustrating the posts disposed adjacent a redistribution layer of the chip package assembly.

Referring to the partial sectional view of FIG. 2, the IC dies 106, 126 include contact pads 202 at which the circuitry 160 of the IC dies 106, 126 terminate. The contact pads 202 are exposed to the bottom surface 140 of the IC dies 106, 126. The top surface 146 of the redistribution layer 102 is fabricated directly on the bottom surface 140 of the IC dies 106, 126. The redistribution layer 102 includes at least 3 layers of metal and dielectrics that are patterned to produce the circuitry 162 of the redistribution layer 102. In one example, routings 204 comprising the circuitry 162, formed by the patterned metal lines 206 and vias 208, within the dielectric layers 210, are directly connected on the top surface 146 of the RDL 102 without solder connections. In this manner, the spacing between the contact pads 202 may have a much finer pitch than connections utilizing solder interconnects. The routings 204 comprising the circuitry 162 terminate and are exposed to the bottom surface 144 of the RDL to facilitate solder connection with the circuitry of the below substrate, e.g., the circuitry 164 of the interposer substrate 104.

Refer solely back to FIG. 1, the circuitry 162 of the redistribution layer 102 is electrically and mechanically coupled to circuitry 164 of the interposer substrate 104 through the solder connections 118. The circuitry 164 of the interposer substrate 104 is similarly connected to the circuitry 166 of the package substrate 108. In the example depicted in FIG. 1, a bottom surface 136 of the interposer substrate 104 is electrically and mechanically coupled to a top surface 134 of the package substrate 108 by solder connections 118 or other suitable connection.

The chip package assembly 100 may be mounted to a printed circuit board (PCB) 116 to form an electronic device 150. In this manner, the circuitry 166 of the package substrate 108 is coupled to the circuitry 168 of the PCB 116 via solder balls 122, or other suitable connection. In the example depicted in FIG. 1, a bottom surface 132 of the package substrate 108 is electrically and mechanically coupled to a top surface 130 of the PCB by the solder balls 122.

The mold compound 112 is in contact with the top surface 146 of the redistribution layer 102. The mold compound 112 also fills a gap 120 defined between the IC dies 106, 126. The mold compound 112 is also present on the outside of the IC dies 106 opposite the gap 120 (i.e., on the side of the IC die 106 opposite the neighboring die 126). In embodiments wherein only a single die is utilized, the mold compound 112 is disposed laterally outward of the IC die 106.

The mold compound 112 provides additional rigidity to the package assembly 100, while also protecting the electrical connections of the IC dies 106, 126 with the circuitry of the redistribution layer 102. The mold compound 112 may be polymeric material, such as an epoxy-based material or other suitable material. When the IC dies 126 are disposed in an overmold compound 128, the mold compound 112 is in contact with the overmold compound 128, the redistribution layer 102 and the IC die 106.

The posts 110 are disposed in the mold compound 112. The posts 110 are utilized to increase the resistance of the mold compound 112 to cracking or delaminating from the side of the IC dies 106, 126, particularly when a portion of the mold compound 112 is removed to expose the bottom surface 140 of the IC die 106 for electrically coupling the circuitry 160 of the IC dies 106, 126 to the circuitry 162 of the redistribution layer 102. When the overmold compound 128 is present, the posts 110 also increase the resistance of the mold compound 112 to cracking, separating or delaminating from the overmold compound 128.

The posts 110 are fabricated from a material having a hardness greater than a hardness of the mold compound 112. The posts 110 may be fabricated from a dielectric or metal material. In one example, the posts 110 are fabricated from one or more metal layers. For example, the posts 110 may be fabricated from copper, titanium or other suitable metal material. When the posts 110 are fabricated from copper, the posts 110 may include one or more seed layers to facilitate plating, such as titanium, tungsten, tantalum, and nickel vanadium, among others.

The posts 110 generally have an elongated geometry, having a major axis in the long direction, which is substantially perpendicular to the bottom surface 140 of the IC die 106 and top surface 138 of the interposer substrate 104. The cross-sectional profile of the posts 110 is generally circular, but may have any other suitable geometry.

The posts 110 generally have a bottom surface 170 that is coplanar and in contact with the top surface 146 of the redistribution layer 102. The bottom surfaces 170 of the posts 110 generally are also coplanar with the bottom surface 114 of the mold compound 112. Each post 110 generally extends from a bottom surface 170 to a top surface 172, such that a length of the post 110 defined between the surfaces 170, 172 is at least partially overlapped with a sidewall 124 of the IC die 106. The sidewall 124 of the IC die 106 generally defines the height of the IC die 106, that is, the distance between the top and bottom surfaces 140, 142 of the IC die 106.

In one example, the top surface 172 of the posts 110 is coplanar with the top surface 142 of the IC die 106. In another example, the top surface 172 of the posts 110 is below the top surface 142 of the IC die 106. The bottom surface 170 of the posts 110, regardless of the location of the top surface 172, may extend below the bottom surface 140 of the IC die 106. It is contemplated that in some examples, the bottom surface 170 may extend into the redistribution layer 102.

In another example having IC dies 126 arranged in a stack, the top surface 172 of the posts 110 is coplanar with the top surface 142 of the uppermost the IC die 126. In another example, the top surface 172 of the posts 110 is below the top surface 142 of the uppermost the IC die 126. The bottom surface 170 of the posts 110, regardless of the location of the top surface 172, may extend below the bottom surface 140 of the bottommost the IC die 126. It is contemplated that in some examples, the bottom surface 170 may extend into the redistribution layer 102.

The posts 110 may be formed prior to or after the deposition of the mold compound 112. For example, the posts 110 may be formed on a temporary carrier (as shown and described below) prior to or after the deposition of the mold compound 112 around the IC dies 106 and the posts 110. The posts 110 may be formed on the temporary carrier, for example, by plating or other suitable deposition technique. In another example, the mold compound 112 may be deposited around the IC dies 106, 126, then a hole formed in the mold compound 112 in which the post 110 is disposed. The hole containing the post 110 may be formed by etching, laser drilling, embossing, thermoforming, mechanical drilling or other suitable technique.

The posts 110 generally are provided to improve the cracking and delamination resistance of the mold compound 112. As such, the posts 110 are not coupled to the circuitry 160 of the IC dies 106, 126. The posts 110 may also not be coupled to the circuitry 162 of the redistribution layer 102. The posts 110 may also not be coupled to the circuitry 164 of the interposer substrate 104. In the example depicted in FIG. 1, the posts 110 are electrically floating relative one or more or even all of the circuitries 160, 162, 164 of the IC dies 106, 126, the redistribution layer 102 and the interposer substrate 104.

The posts 110 may be fabricated from a material that increases the stiffness of the mold compound 112. Suitable materials include materials having good adhesion to and greater hardness than mold compound 112. Suitable materials may be either electrically conductive or electrically non-conductive materials. Suitable materials may be either more thermally conductive than the mold compound 112. Suitable materials include metals, such as copper, solder, titanium, tantalum, and nickel vanadium, among others. Suitable materials also include industrial diamonds retained in a binder. The posts 110 may be single solid mass, or comprised of multiple elements, such as powder, metal wool, or discrete shapes, that are held in a binder. The material comprising the posts 110 may also be solder paste, metal fibers, metal powder, metal particles, metal balls, thermally conductive adhesive or other suitable thermally conductive material.

In one example, the posts 110 are thermally conductive and provide robust conductive heat transfer paths between the IC dies 106, 126 vertically away from the top surface 138 of the interposer substrate 104. If a cover (not shown) is utilized over the dies 106,126, thermal interface materials (TIM) may be utilized between the posts 110 and the cover to provide a robust heat transfer interface between the posts 110 and the cover to channel heat out from between the IC dies 106, 126.

The posts 110 may have any suitable sectional profile, and generally have a length that is at least the same as the height of the IC die 106. In one example, the sectional profile of the post 110 is circular. The number, size, density and location of the posts 110 may be selected to provide a desired shear resistance between the mold compound 112 and at least one of the IC dies 106, 126 and overmold compound 128 (when present).

Figure 3:
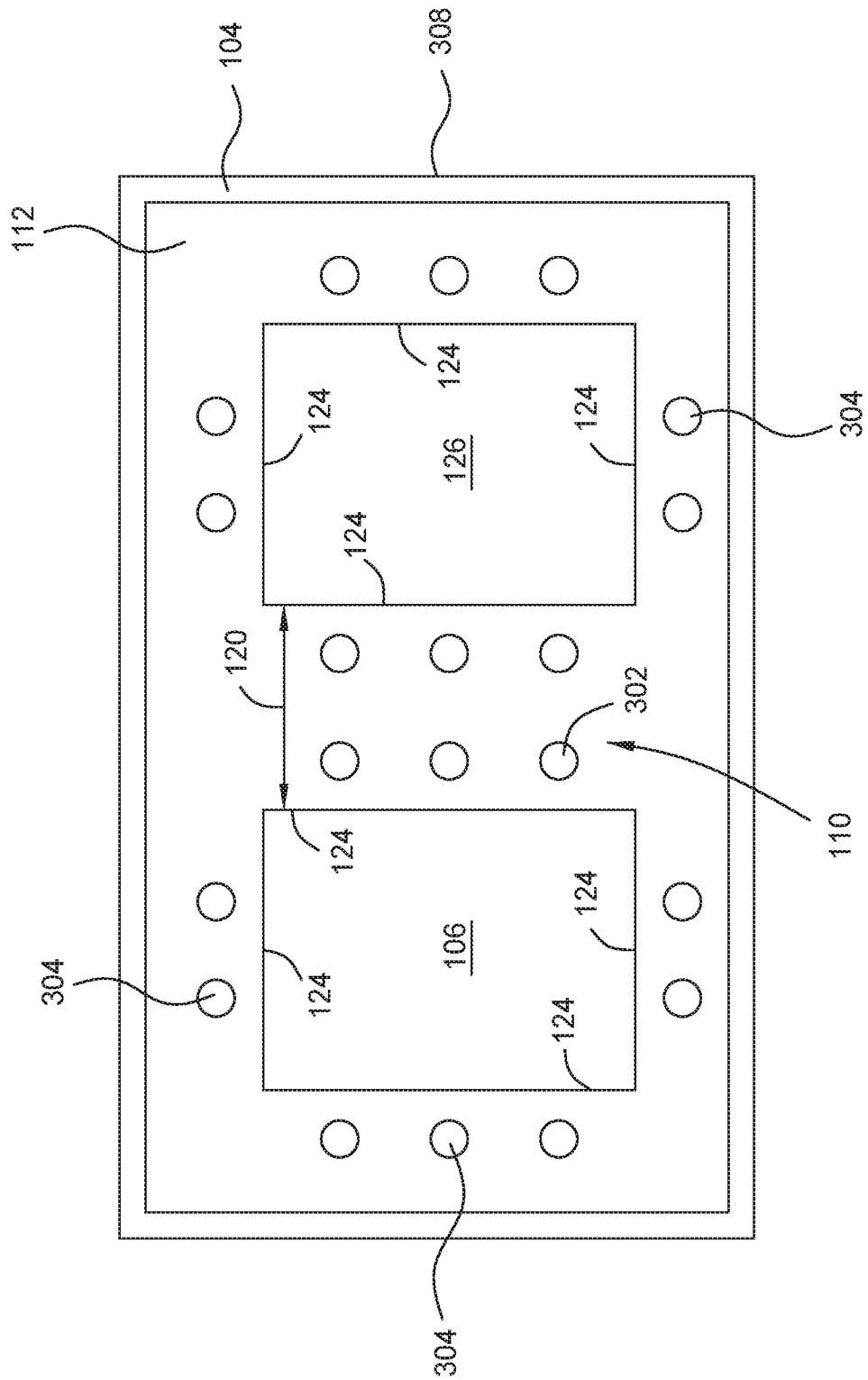
FIG. 3 is a schematic top view of the chip package assembly of FIG. 1 revealing an exemplary geometric arrangement of the posts disposed around the IC dies.

FIG. 3 is a schematic top view of the chip package assembly 100 of FIG. 1 to reveal an exemplary geometric arrangement of the posts 110 disposed between the IC dies 106, 126. In the example depicted in FIG. 3, the posts 110 include posts 302 that are disposed between adjacent IC dies 106, 126. Optionally, the posts 110 may include posts 304 that are disposed outward of the IC dies 106, 126, and between the IC dies 106, 126 and an edge 308 of the interposer substrate 104. Described differently, the posts 304 are disposed outward of the IC dies 106, 126, outward of the overmold compound 128, when present, and are surrounded by the mold compound 112. The location, size and density of the posts 302 may be selected to enhance the resistance of the mold compound 112 to shearing, cracking or otherwise delaminating in desired locations. The location, size and density of the posts 304, when present, may be selected to enhance vertical heat transfer through the mold compound 112 in desired locations. Additional details of the posts 110 are provided in the exemplary non-limiting examples provided in Figures further described below.

Figure 4:
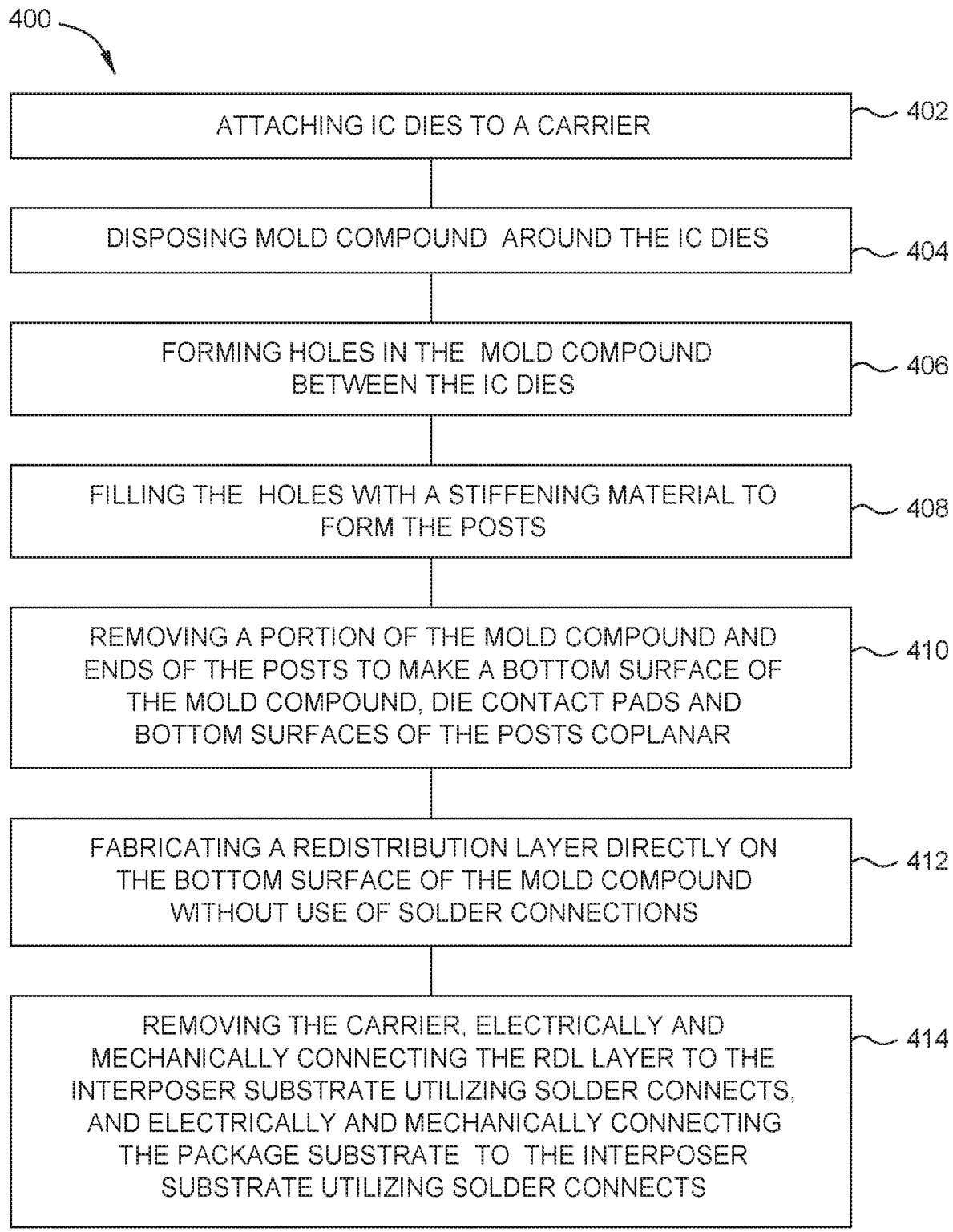
FIG. 4 is a flow diagram of a method for fabricating a chip package assembly having posts configured to enhance reliability of circuitry within the redistribution layer.

FIG. 4 is a flow diagram of a method 400 for fabricating a chip package assembly having electrically floating posts 110 between adjacent IC dies, such as the chip package assembly 100 described above with reference to FIGS. 1-2, and the like. FIGS. 5A-5F are schematic sectional views of a chip package assembly at different stages of the method 400 of FIG. 4. It should be noted that the orientation of the dies 106, 126 and other components illustrated in FIGS. 5A-5F is different by 180 degrees as compared to FIG. 1. Stated differently, the orientation of the dies 106, 126 and other components illustrated FIGS. 5A-5F is upside down as compared to the orientation shown in FIG. 1.

Figure 5A:
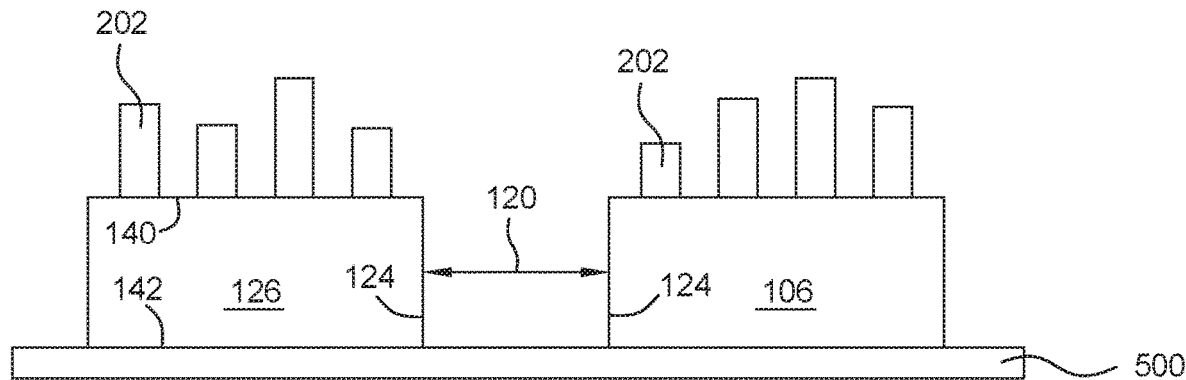
FIGS. 5A-5F are schematic sectional views of a chip package assembly at different stages of the method of FIG. 4.

The method 400 begins at operation 402 by attaching IC dies 106, 126 to a carrier 500, as illustrated in FIG. 5A. The carrier 500 is utilized only during the initial fabrication operations, and as such is removably attached to attaching the IC dies 106, 126 prior to mounting the IC dies 106, 126 to a substrate, such as the interposer substrate 104, and completing the fabrication of the chip package assembly 100. In one example, the top surfaces 142 of the IC dies 106, 126 are attached to the carrier 500 using releasable pressure sensitive adhesive. The IC die or dies 126 may be encapsulated in an overmold compound 128, such as described and shown above with reference to FIG. 1.

Figure 5B:
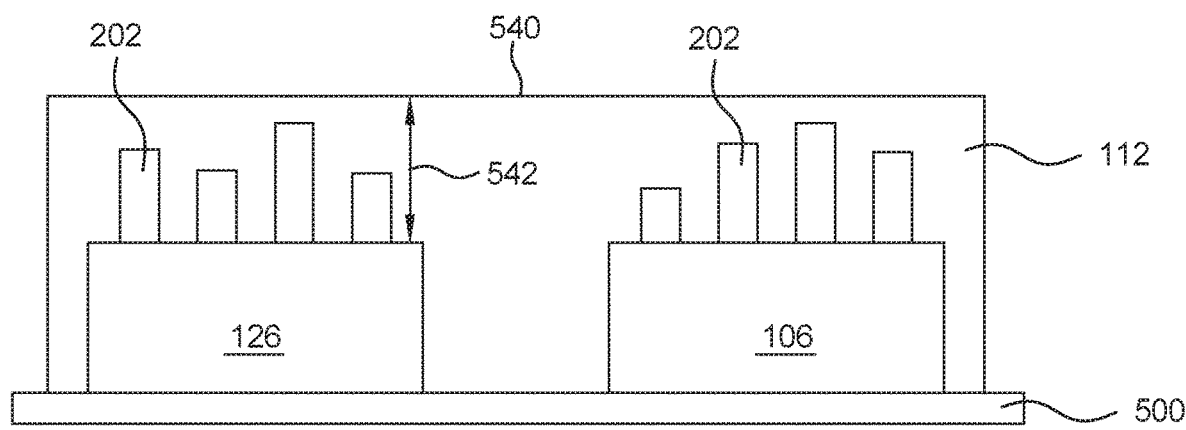

At operation 404, mold compound 112 is disposed around the dies 106, 126 and in contact with the carrier 500. The mold compound 112 extends beyond the bottom surface 140 of the IC dies 106, 126 to an initial surface 540, as illustrated in FIG. 5B. An initial height 542 is defined as a distance defined between the initial surface 540 and the bottom surfaces 140 of the IC dies 106, 126. The mold compound 112 may be spin on, dispensed, over molded or deposited by another suitable method. At operation 404, the mold compound 112 fills the gap 120 defined between adjacent dies 106, 126.

Figure 5C:
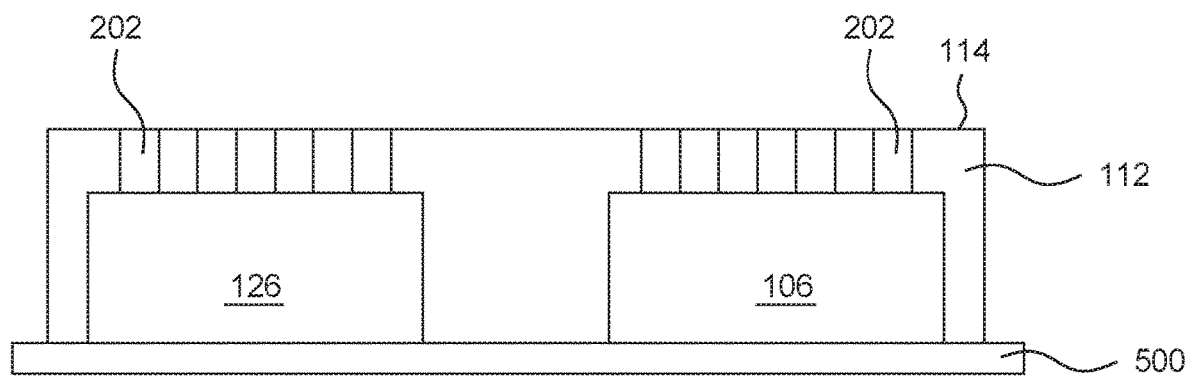

At operation 406, holes 502 are formed in the mold compound 112 between the IC dies 106, 126, as shown in FIG. 5C. The holes 502 may be formed, for example, by etching, laser drilling, embossing, thermoforming, mechanical drilling or other suitable technique. The holes 502 may have a depth that is less than the initial height 542, that extends to distance defined between the top and bottom surface 140, 142 of the IC die 106, or that extends to the carrier 500 (making the end of the holes 502 essentially coplanar with the top surface 142 of the IC dies 106, 126 such that the carrier 500 is exposed through the hole 502).

Figure 5D:
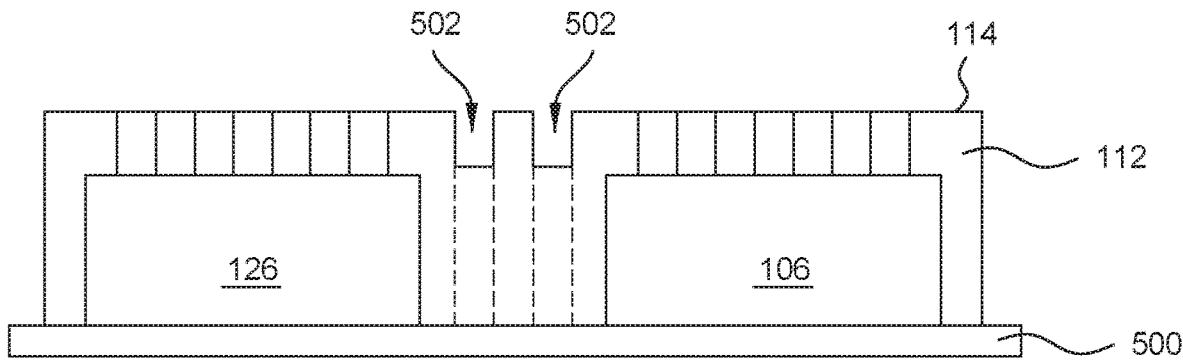

At operation 408, the holes 502 are subsequently filled with a stiffening material to form the posts 110, as shown in FIG. 5D. The holes 502 may be filed by dispensing material into the holes 502 or plating material in the holes 502 to form the posts 110. In one example, a seed layer 504 is deposited in the hole 502. For example, the seed layer 504 may be deposited on the mold compound 112 forming the bottom of the hole 502 or may be deposited on the carrier 500 when exposed through the hole 502. The seed layer 504 may be deposited using chemical vaper deposition, physical vapor deposition, inkjet printing or other suitable technique. The seed layer 504 provides an adhesion layer for metal materials subsequently deposited in the hole 502 to continue the formation of the posts 110. The seed layer 504 may optionally be deposited on the sidewalls of the holes 502. In the example depicted in FIG. 5D, the seed layer 504 is fabricated from copper. Subsequent to the deposition of the seed layer 504, a bulk conductor 506 is deposited on the seed layer 504, as illustrated in FIG. 5D. The bulk conductor 506 may be deposited on the seed layer 504 using electroless plating, electro-plating, chemical vaper deposition, physical vapor deposition, or other suitable technique. The bulk conductor 506 fills the holes 502 completely or close to the initial surface 540 of the mold compound 112. In the example depicted in FIG. 5D, the bulk conductor 506 is copper that is plated directly on the seed layer 504. When the holes 502 are shallow, advantageously less material is needed to fill the holes 502 and form the posts 110, which provides a cost savings. When the holes 502 are deep, conductive material filling the holes 502 and forming the posts 110 promotes heat transfer out of the chip package assembly 100, which advantageously improves performance reliability.

Figure 5E:
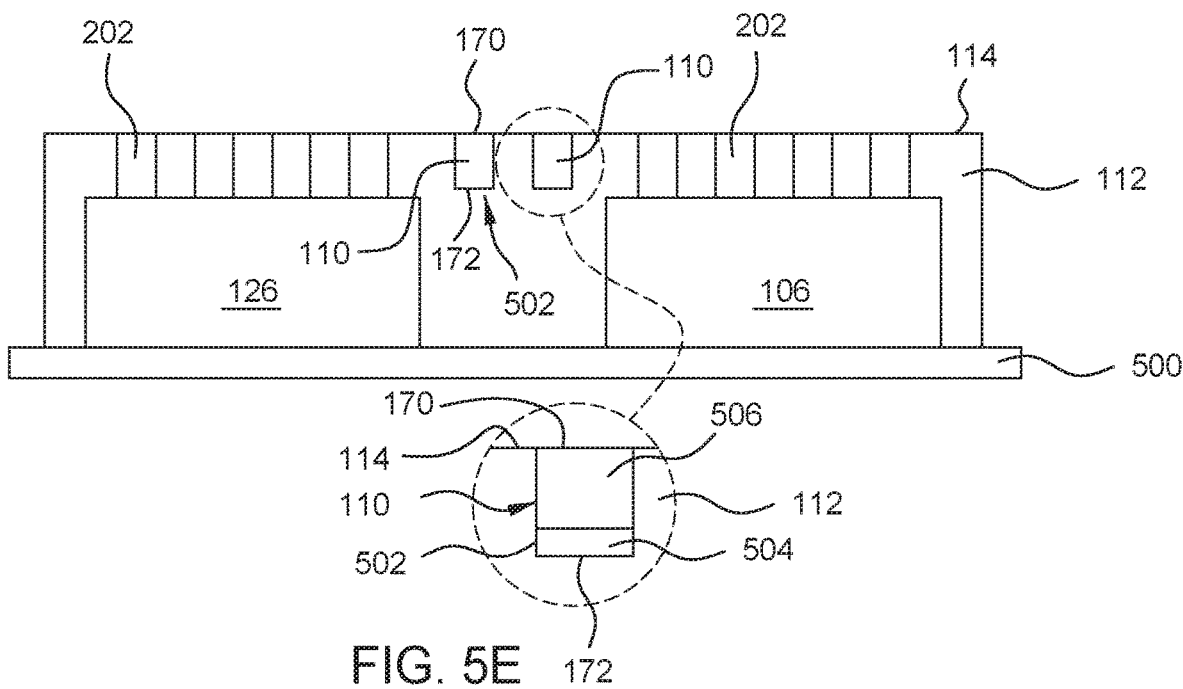

At operation 410, the initial surface 540 of the mold compound 112 and the ends of the posts 110 are ground, mechanically or otherwise removed to make a bottom surface 114 of the mold compound 112, die contact pads 202 and bottom surfaces 170 of the posts 110 coplanar, as illustrated in FIG. 5E. The posts 110 inhibit the mold compound 112 from initiating cracks, cracking, delaminating or otherwise separating from the sidewalls 124 of the dies 106, 126 (and/or overmold compound 128, when present). With less potential for crack initiation, cracking, delaminating or otherwise separating from the sidewalls 124 of the dies 106, 126, such defects are significantly less likely to propagate into the RDL layer 102 where one or more of the routings 204 may be compromised, leading to reduced performance and even failure of the chip package assembly 100.

Figure 5F:
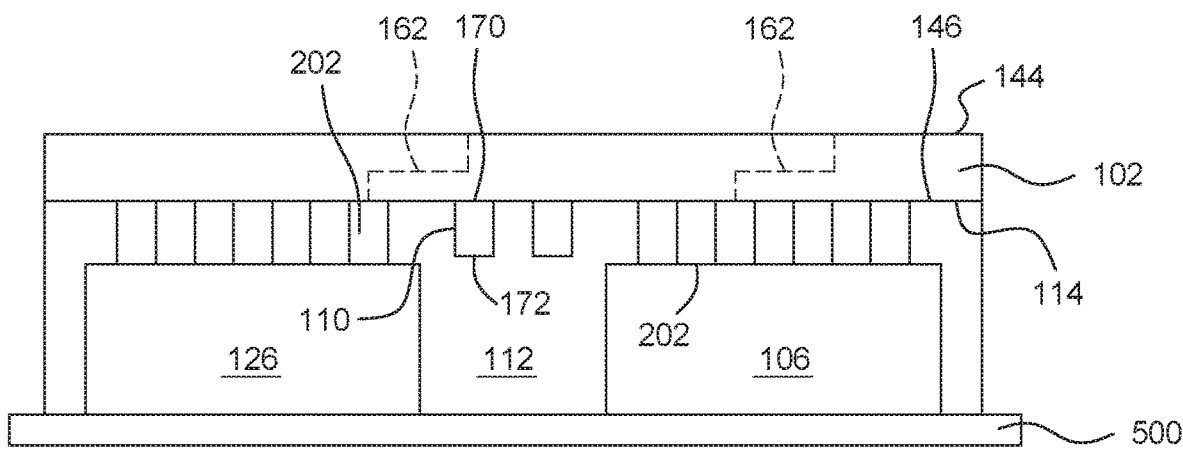

At operation 412, the RDL layer 102 is fabricated directly on the bottom surface 114 of the mold compound 112 without use of solder connections, as shown in FIG. 5F. The RDL layer 102 is fabricated by depositing at least 3 or more dielectric layers in which metal routings 204 are formed. The metal routings 204 may be in the form of interconnected metal lines 206 and vias 208 that form the circuitry 162 of the redistribution layer 102.

At operation 414, the carrier 500 is removed and the RDL layer 102 is electrically and mechanically connected to the interposer substrate 104 utilizing solder connects 118, as shown in FIG. 1. At operation 414, the package substrate 108 is also electrically and mechanically connected to the interposer substrate 104 utilizing solder connects 118 to complete the fabrication of chip package assembly 100. The fabrication of chip package assembly 100 may include other steps and components in addition to the utilization of the posts 110 described above.

Figure 6:
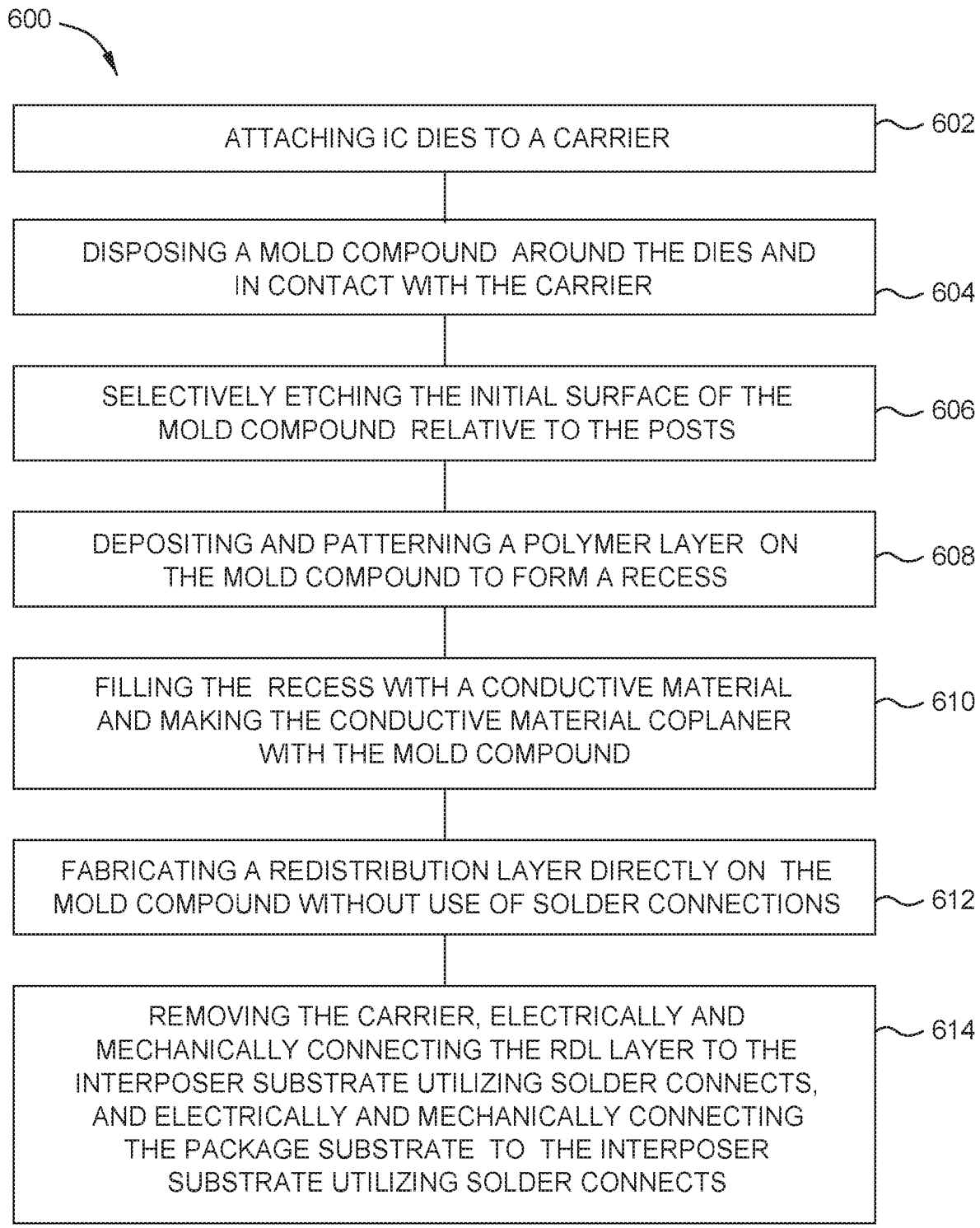
FIG. 6 is a flow diagram of a method for fabricating a chip package assembly configured to enhance reliability of circuitry within the redistribution layer.

FIG. 6 is a flow diagram of a method 600 for fabricating a chip package assembly having IC dies 106, 126 disposed in a mold compound 112, similar to the chip package assembly 100 described above with reference to FIGS. 1-2, except that the chip package assembly fabricated utilizing the method 600 optionally need not have electrically floating posts 110 disposed between adjacent IC dies 106, 126. FIGS. 7A-7G are schematic sectional views of a chip package assembly at different stages of the method 600 of FIG. 6. It should be noted that the orientation of the dies 106, 126 and other components illustrated in FIGS. 7A-7G is different by 180 degrees as compared to FIG. 1. Stated differently, the orientation of the dies 106, 126 and other components illustrated FIGS. 7A-7G is upside down as compared to the orientation shown in FIG. 1.

Figure 7A:
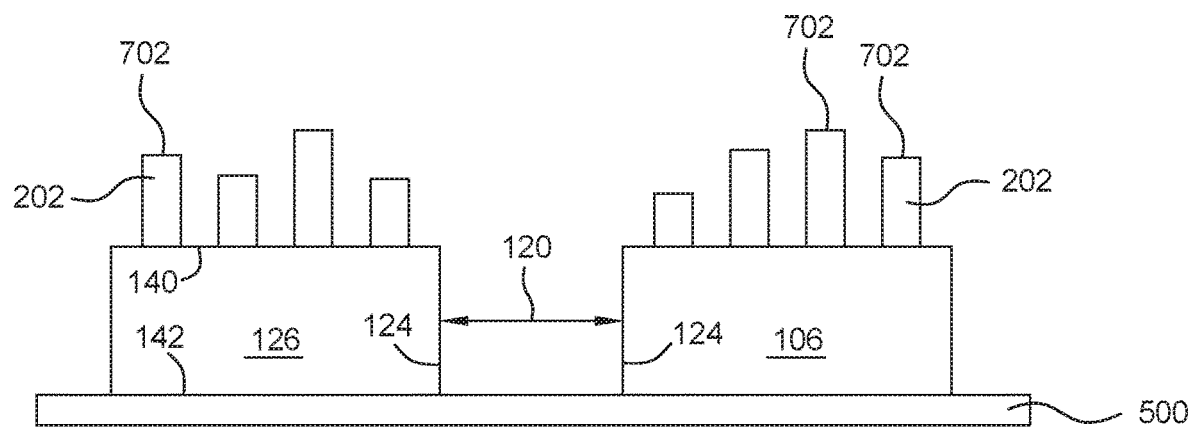
FIGS. 7A-7G are schematic sectional views of a chip package assembly at different stages of the method of FIG. 6.

The method 600 begins at operation 602 by attaching IC dies 106, 126 to a carrier 700, as illustrated in FIG. 7A. The carrier 700 is utilized only during the initial fabrication operations, and as such is removably attached to attaching the IC dies 106, 126 prior to mounting the IC dies 106, 126 to a substrate, such as the interposer substrate 104, and completing the fabrication of the chip package assembly 100. In one example, the top surfaces 142 of the IC dies 106, 126 are attached to the carrier 700 using releasable pressure sensitive adhesive. The IC die or dies 106, 126 may be encapsulated in an overmold compound 128, such as described and shown above with reference to FIG. 1.

Figure 7B:
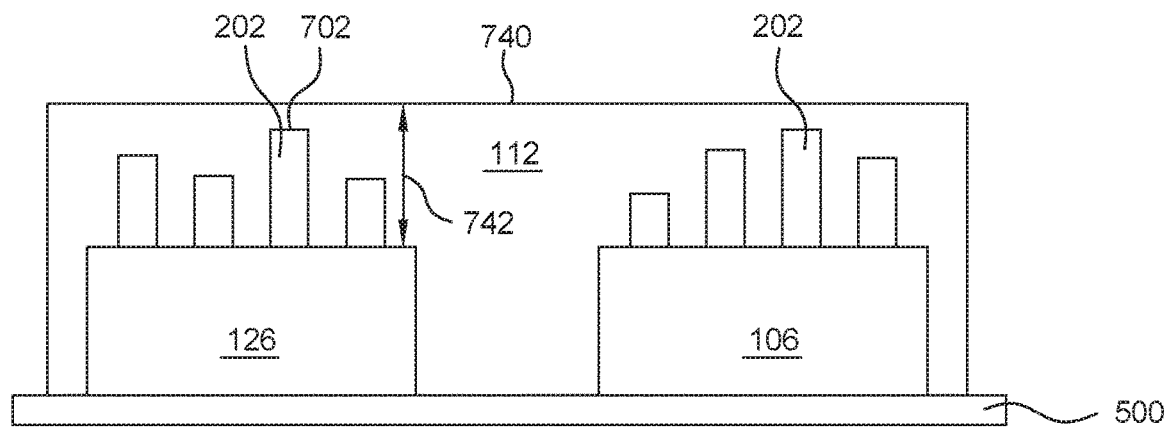

At operation 604, mold compound 112 is disposed around the dies 106, 126 and in contact with the carrier 700. The mold compound 112 extends beyond the bottom surface 140 of the IC dies 106, 126 to an initial surface 740, as illustrated in FIG. 7B. An initial height 742 is defined as a distance defined between the initial surface 740 and the bottom surfaces 140 of the IC dies 106, 126. The mold compound 112 may be spin on, dispensed, over molded or deposited by another suitable method. At operation 604, the mold compound 112 fills the gap 120 defined between adjacent dies 106, 126. As shown in FIG. 7B, spacing between the distal ends 702 of the contact pads 202 and the initial surface 740 of the mold compound 112 may vary across a single one of the IC dies 106, 126, and/or may vary across IC dies 106, 126. The thickness of mold compound 112 is generally greater than or equal to the distance that the longest of the contact pads 202 extends beyond the bottom surfaces 140 of the IC dies 106, 126.

Figure 7C:
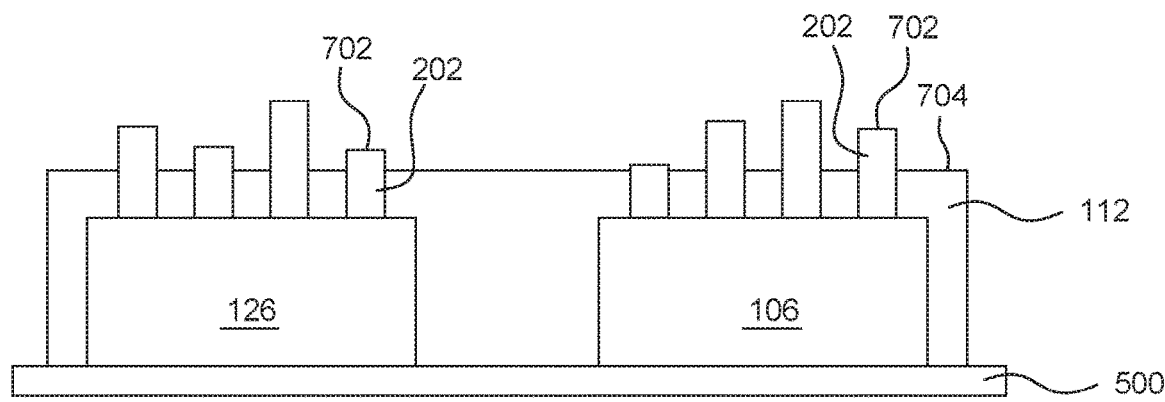

At operation 606, the initial surface 740 of the mold compound 112 is selectively etched relative to the posts 110 to define a secondary surface 704 in the mold compound 112, as illustrated in FIG. 7C. The selective etching allows the distal ends 702 of the contact pads 202 to extend beyond the secondary surface 704 of the mold compound 112.

Figure 7D:
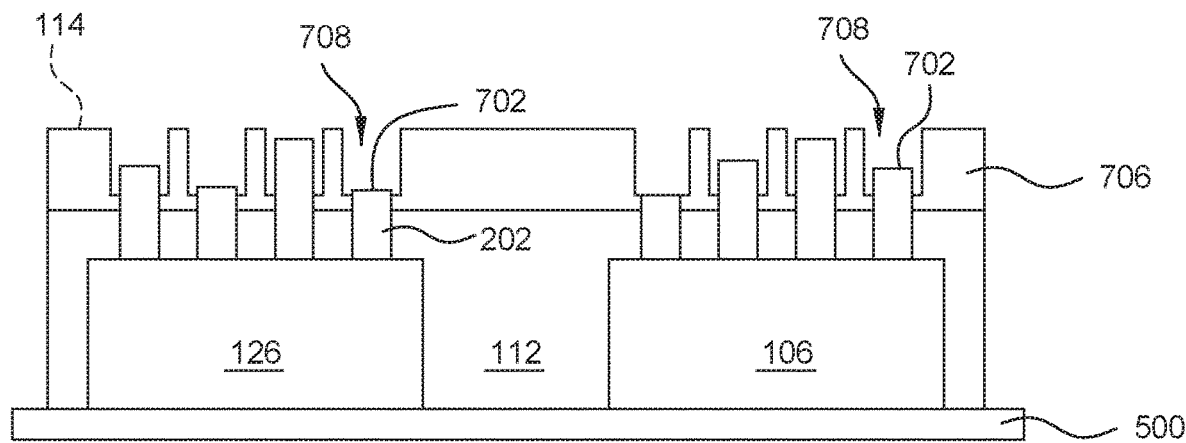

At operation 608, a polymer layer 706 is deposited and patterned on the secondary surface 704 of the mold compound 112, as shown in FIG. 7D. The polymer layer 706 is patterned such the recesses 708 are formed exposing the distal ends 702 of the contact pads 202. In one example, the recesses 708 are formed around each distal end 702 of the contact pads 202. The thickness of the polymer layer 706 is sufficient such that each distal end 702 of the contact pads 202 is recessed within the recess 708. Stated differently, the distal ends 702 are below the secondary surface 704 of the mold compound 112 after the polymer layer 706 is patterned. In one example, the polymer layer 706 is formed from polyimide or other suitable dielectric material. After patterning, the exposed surface of the polymer layer 706 becomes the bottom surface 114 of the mold compound 112.

Figure 7E:
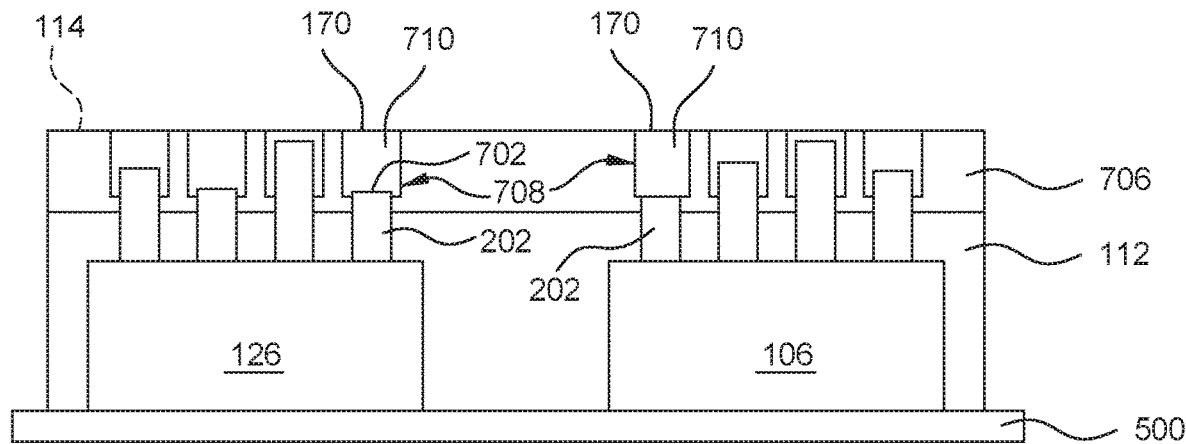

At operation 610, the recesses 708 are filled with a conductive material 710 and made coplanar with initial surface 740 of the mold compound 112, as illustrated in FIG. 7E. The conductive material 710 filling the recess 708 extends the circuitry 160 of the dies 106, 126 to be coplanar with the bottom surface 114 of the mold compound 112 such that the circuitry 162 of the RDL layer 102 may be formed directly (i.e., without solder connections) on the conductive material 710. As the mold compound 112 is not subjected to grinding or other mechanically processes that induce shear forces to the mold compound 112, the mold compound 112 is substantially free from crack initiations, cracking, delamination or other separation from the sidewalls 124 of the dies 106, 126 (and/or overmold compound 128, when present). With less potential for crack initiations, cracking, delamination or other separation from the sidewalls 124 of the dies 106, 126, such defects are significantly less likely to propagate into the RDL layer 102 where one or more of the routings 204 may be compromised, leading to reduced performance and even failure of the chip package assembly 100.

Figure 7F:
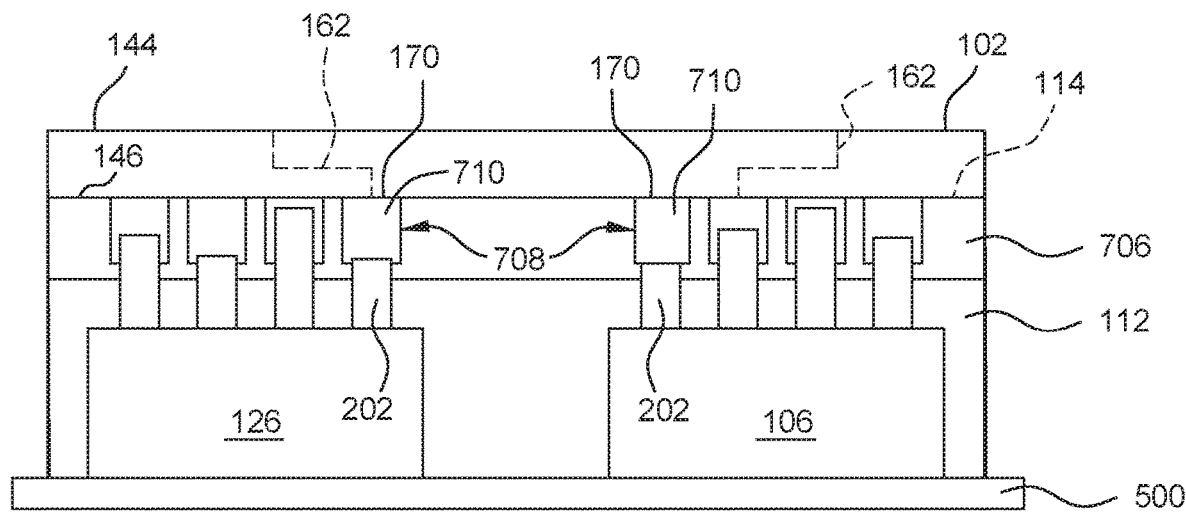

At operation 612, the RDL layer 102 is fabricated directly on the bottom surface 114 of the mold compound 112 without use of solder connections, as shown in FIG. 7F. The RDL layer 102 is fabricated by depositing at least 3 or more dielectric layers in which metal routings 204 are formed. The metal routings 204 may be in the form of interconnected metal lines 206 and vias 208 that form the circuitry 162 of the redistribution layer 102. By forming the RDL layer 102 is fabricated directly on the bottom surface 114 of the mold compound 112 without use of solder connections, higher pitch densities for electric interfaces with the dies 106, 126 may be realized.

Figure 7G:
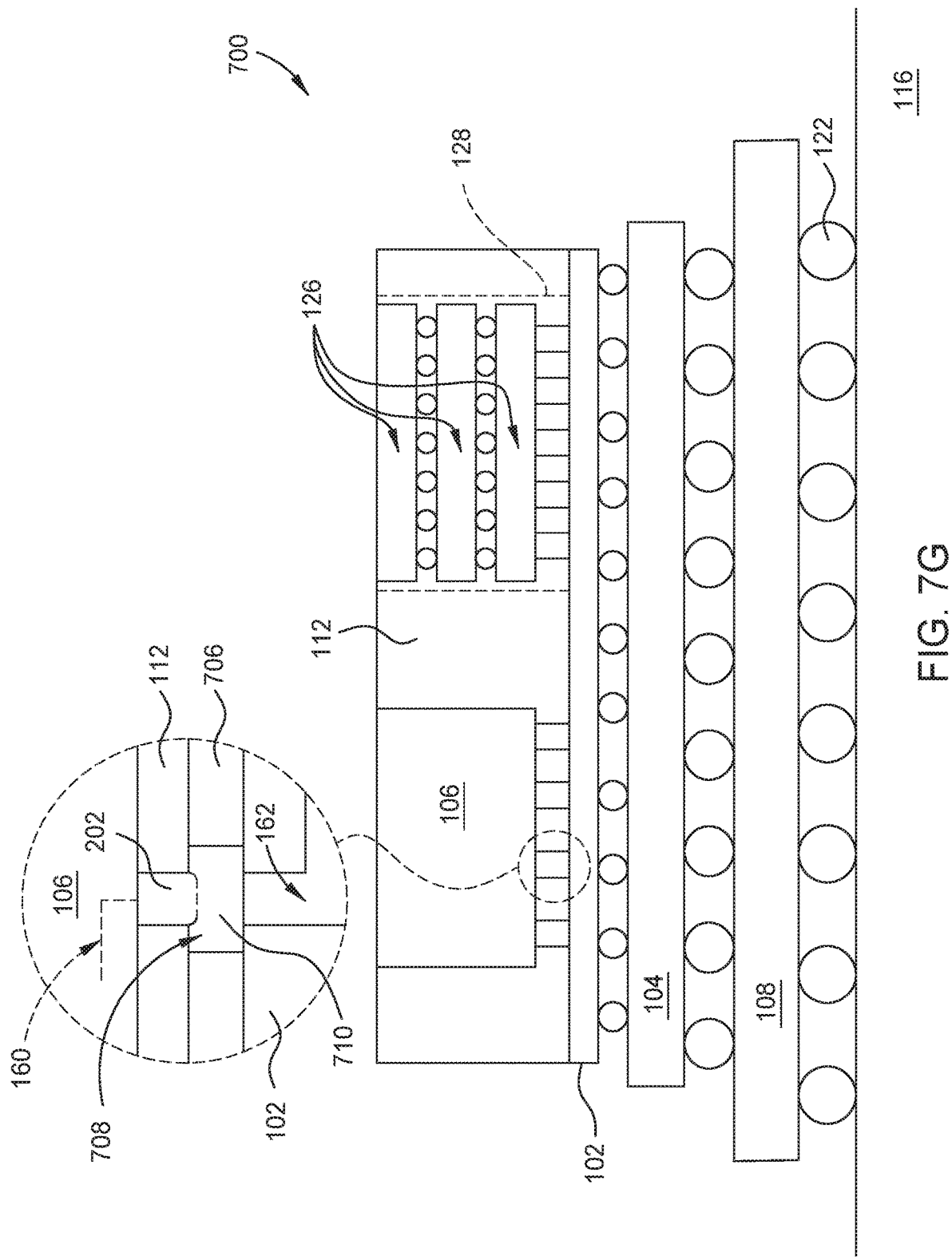

At operation 614, the carrier 700 is removed and the RDL layer 102 is electrically and mechanically connected to the interposer substrate 104 utilizing solder connects 118, as shown in FIG. 7G. At operation 614, the package substrate 108 is also electrically and mechanically connected to the interposer substrate 104 utilizing solder connects 118 to complete the fabrication of a chip package assembly 700. The chip package assembly 700 is essentially the same as the chip package assembly 100, except for the lack of posts 110 and the configuration of how the contact pads 202 and conductive material 710 make the connection between the circuitry 160 of the IC dies 106, 126 and the circuitry 162 of the RDL layer 102. The fabrication of chip package assembly 700 may include other steps and components.

Figure 8:
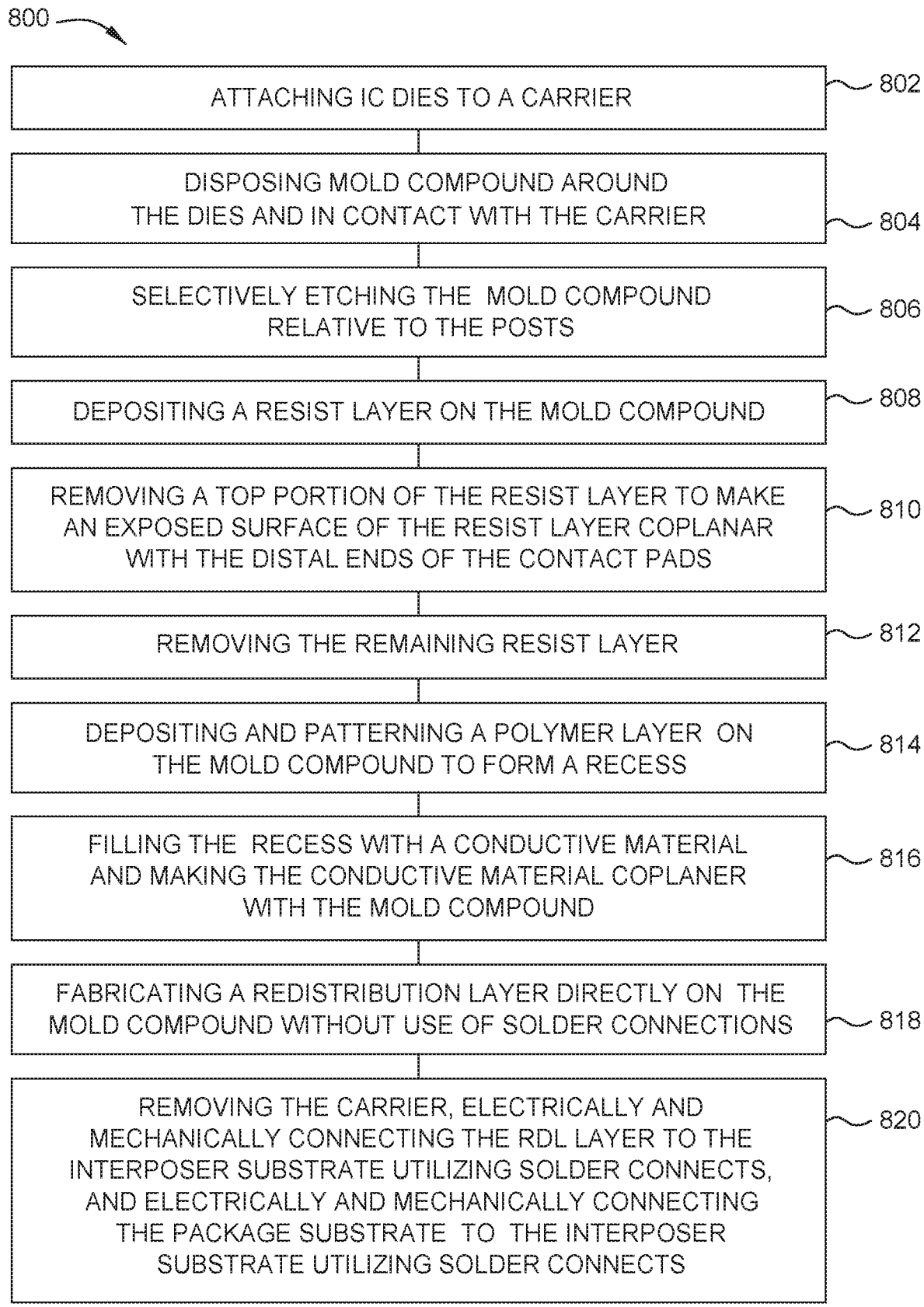
FIG. 8 is a flow diagram of another method for fabricating a chip package assembly configured to enhance reliability of circuitry within the redistribution layer.

FIG. 8 is a flow diagram of a method 800 for fabricating a chip package assembly having IC dies 106, 126 disposed in a mold compound 112, similar to the chip package assembly 100 described above with reference to FIGS. 1-2, except that the chip package assembly fabricated utilizing the method 600 optionally need not have electrically floating posts 110 disposed between adjacent IC dies 106, 126. FIGS. 9A-9I are schematic sectional views of a chip package assembly at different stages of the method 800 of FIG. 8. It should be noted that the orientation of the dies 106, 126 and other components illustrated in FIGS. 9A-9I is different by 180 degrees as compared to FIG. 1. Stated differently, the orientation of the dies 106, 126 and other components illustrated FIGS. 9A-9I is upside down as compared to the orientation shown in FIG. 1.

Figure 9A:
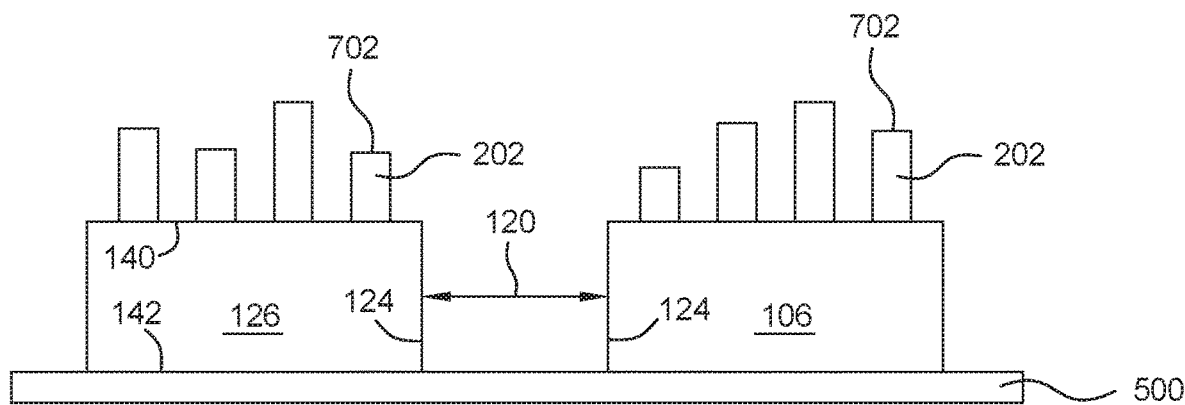
FIGS. 9A-9I are schematic sectional views of a chip package assembly at different stages of the method of FIG. 6.

The method 800 begins at operation 802 by attaching IC dies 106, 126 to a carrier 900, as illustrated in FIG. 9A. The carrier 900 is utilized only during the initial fabrication operations, and as such is removably attached to attaching the IC dies 106, 126 prior to mounting the IC dies 106, 126 to a substrate, such as the interposer substrate 104, and completing the fabrication of the chip package assembly 100. In one example, the top surfaces 142 of the IC dies 106, 126 are attached to the carrier 900 using releasable pressure sensitive adhesive. The IC die or dies 106, 126 may be encapsulated in an overmold compound 128, such as described and shown above with reference to FIG. 1.

Figure 9B:
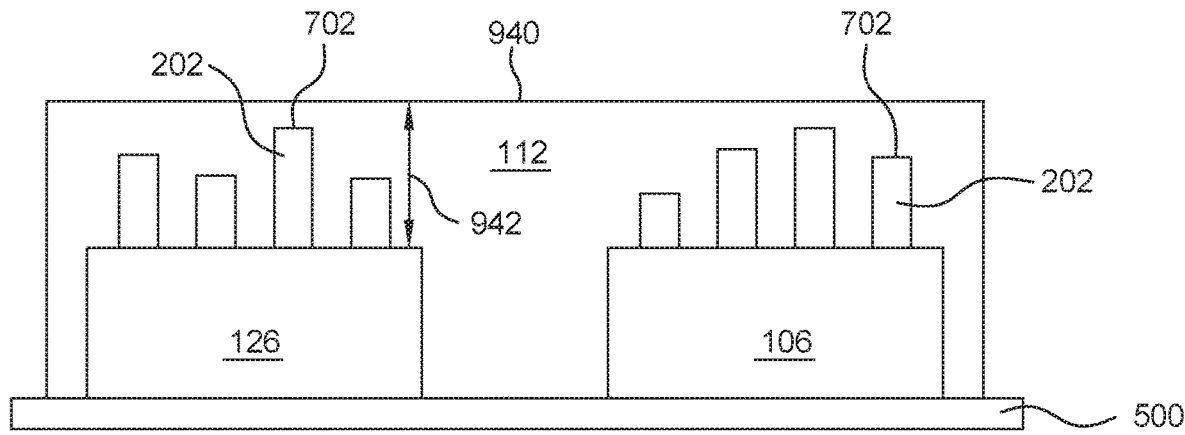

At operation 804, mold compound 112 is disposed around the dies 106, 126 and in contact with the carrier 900. The mold compound 112 extends beyond the bottom surface 140 of the IC dies 106, 126 to an initial surface 940, as illustrated in FIG. 9B. An initial height 942 is defined as a distance defined between the initial surface 940 and the bottom surfaces 140 of the IC dies 106, 126. The mold compound 112 may be spin on, dispensed, over molded or deposited by another suitable method. At operation 804, the mold compound 112 fills a gap 120 defined between the adjacent dies 106, 126. As shown in FIG. 9B, spacing between the distal ends 702 of the contact pads 202 and the initial surface 940 of the mold compound 112 may vary across a single one of the IC dies 106, 126, and/or may vary across IC dies 106, 126. The thickness of mold compound 112 is generally greater than or equal to the distance that the longest of the contact pads 202 extends beyond the bottom surfaces 140 of the IC dies 106, 126.

Figure 9C:
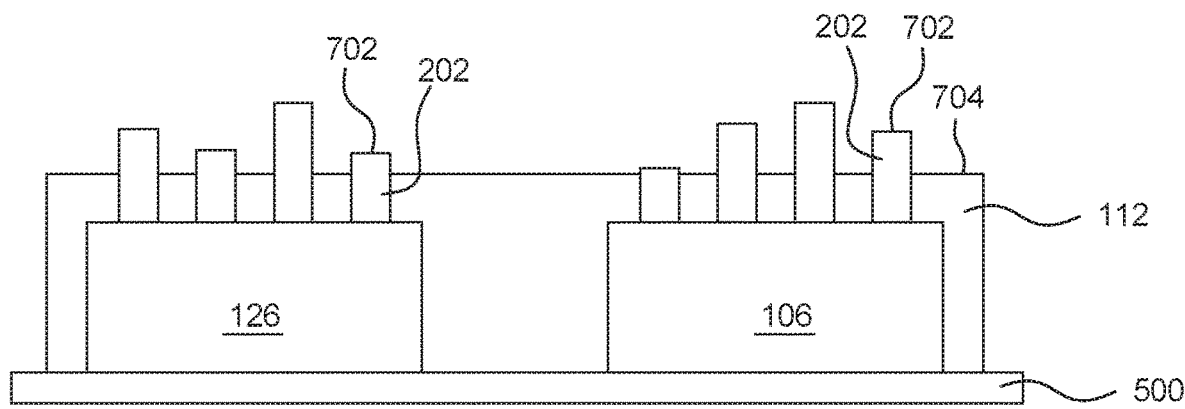

At operation 806, the initial surface 940 of the mold compound 112 is selectively etched relative to the posts 110 to define a secondary surface 904 in the mold compound 112, as illustrated in FIG. 9C. The selective etching allows the distal ends 702 of the contact pads 202 to extend beyond the secondary surface 904 of the mold compound 112.

Figure 9D:
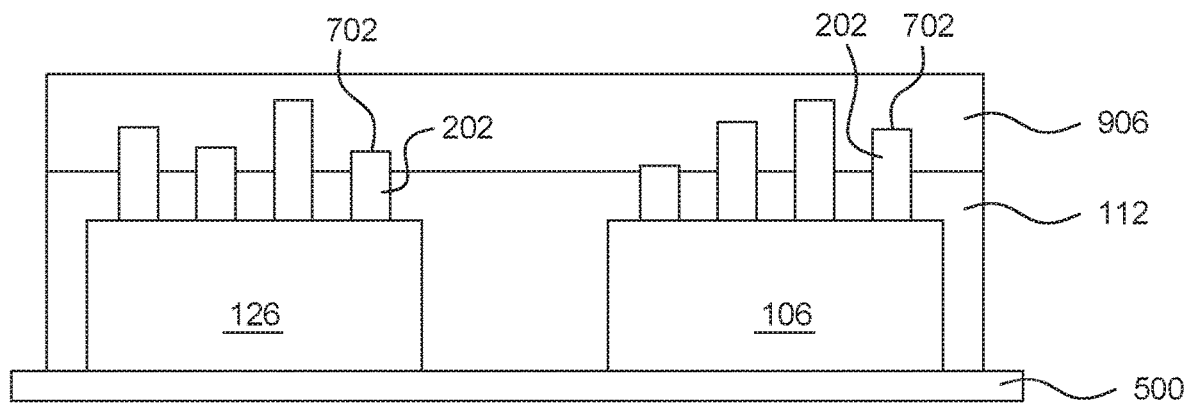

At operation 808, a resist layer 906 is deposited on the secondary surface 904 of the mold compound 112, as shown in FIG. 9D. The resist layer 906 is deposited to a thickness that covers all it not most of the contact pads 202.

Figure 9E:
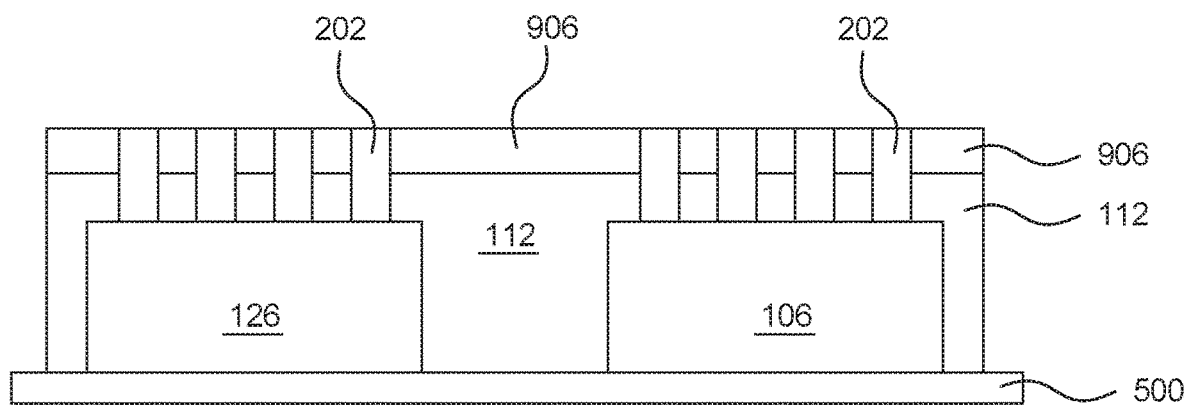

At operation 810, a top portion of the resist layer 906 is removed to make an exposed surface 908 of the resist layer 906 coplanar with the distal ends 702 of the contact pads 202, as shown in FIG. 9E. The top portion of the resist layer 906 may be removed by chemical mechanical polishing, fly-cutting or other suitable process. Operation 808 also removes a portion of some or all of the contact pads 202, such that the distal ends 702 of the contact pads 202 become coplanar with each other, and coplanar with the exposed surface 908 of the resist layer 906. Since the mold compound 112 is protected from the stresses induced while removing the top portion of the resist layer 906 and portion of the contact pads 202, crack initiation, cracking and delamination of the mold compound 112 is substantially prevented.

Figure 9F:
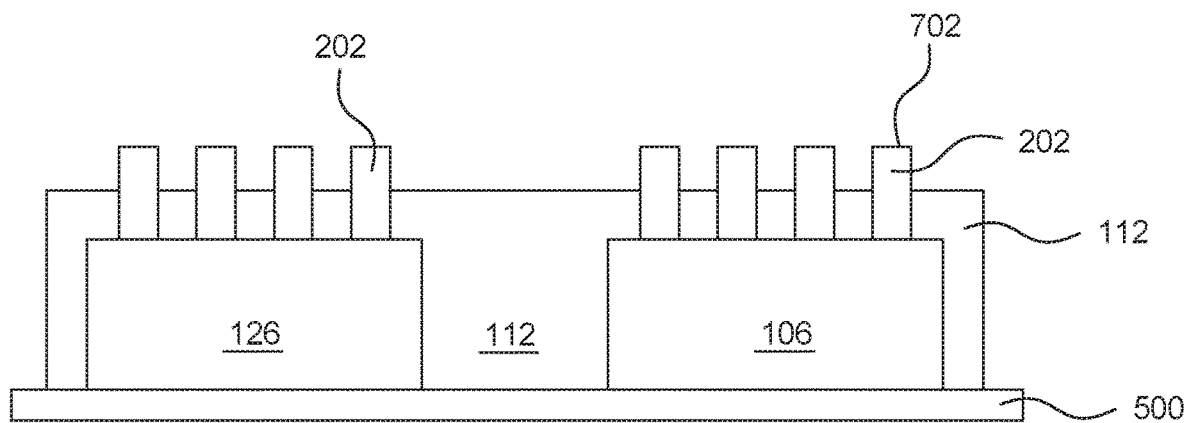

At operation 812, the remaining resist layer 906 is removed, as shown in FIG. 9F. The resist layer 906 may be removed by a resist strip process, for example, a chemical resist removal or other suitable process.

Figure 9G:
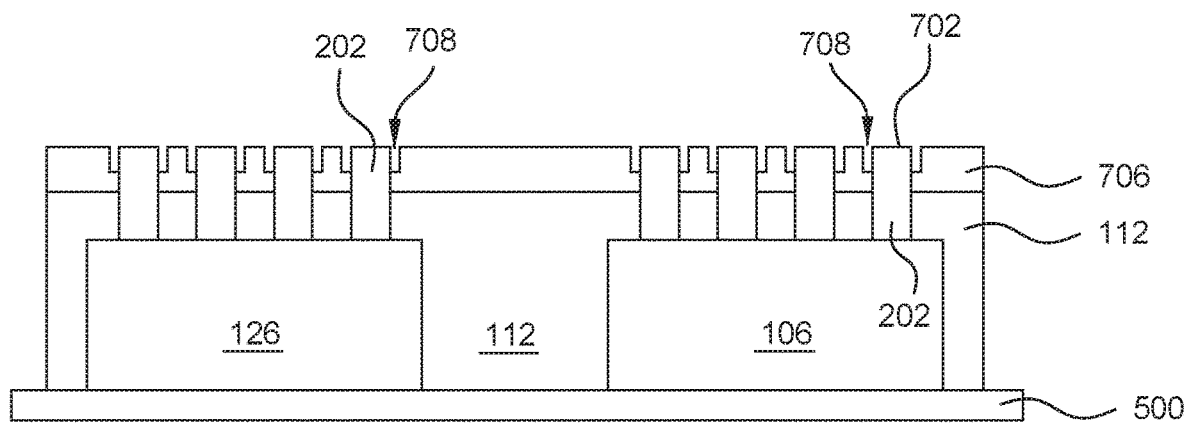

At operation 814, a polymer layer 706 is deposited and patterned on the mold compound 112, as shown in FIG. 9G. The polymer layer 706 is patterned such the recesses 708 are formed around each distal end 702 of the contact pads 202. The thickness of the polymer layer 706 is sufficient such that each distal end 702 of the contact pads 202 is recessed within the recess 708. Stated differently, the distal ends 702 are below the top surface of the polymer layer 706 after the polymer layer 706 is patterned. In one example, the polymer layer 706 is formed from polyimide or other suitable dielectric material. After patterning, the exposed surface of the polymer layer 706 becomes the bottom surface 114 of the mold compound 112.

Figure 9H:
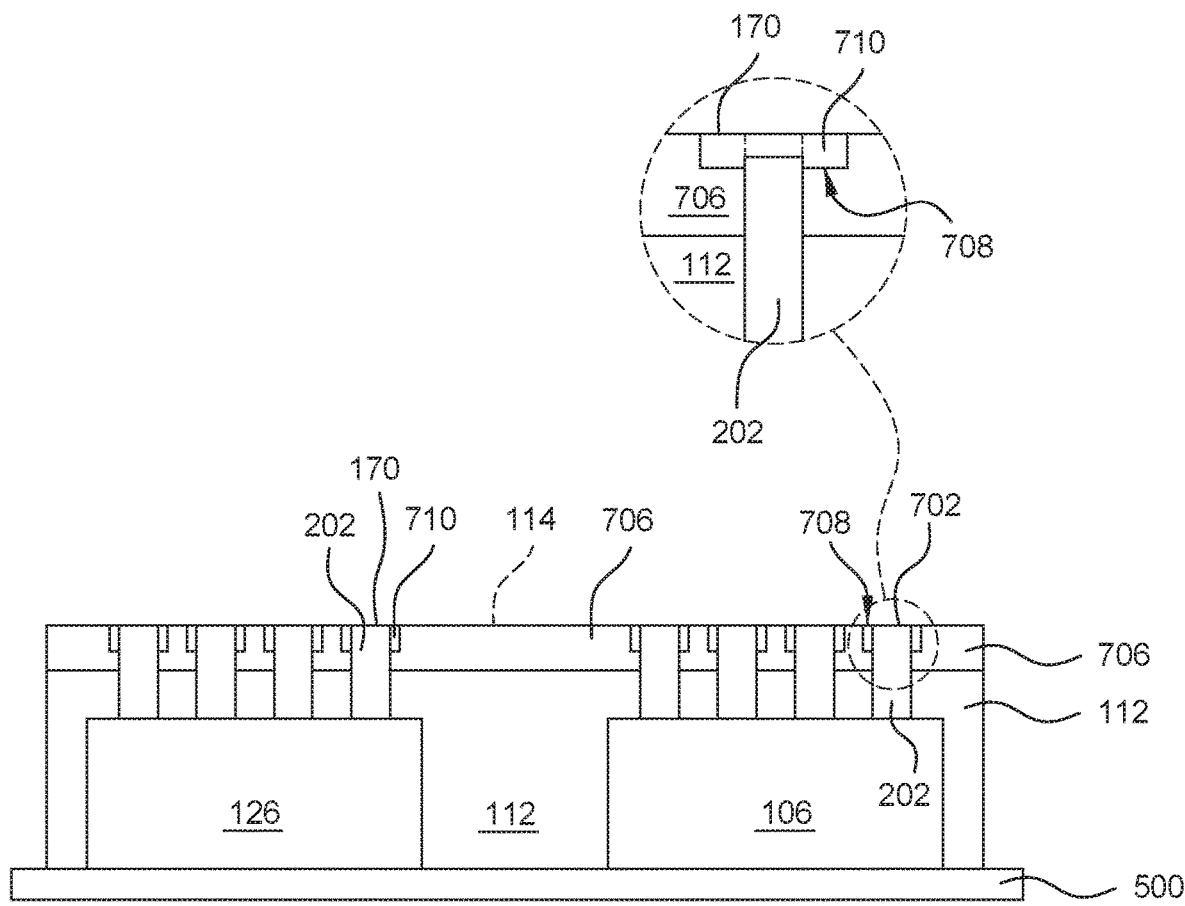

At operation 816, the recesses 708 are filled with a conductive material 710 and made coplanar with the bottom surface 114 of the mold compound 112 (e.g., polymer layer 706), as illustrated in FIG. 9H. The conductive material 710 filling the recess 708 extends the circuitry 160 of the dies 106, 126 to be coplanar with the bottom surface 114 of the mold compound 112 such that the circuitry 162 of the RDL layer 102 may be formed directly (i.e., without solder connections) on the conductive material 710. As the mold compound 112 is not subjected to grinding or other mechanically processes that induce shear forces to the mold compound 112 because it was protected by the resist layer 906, the mold compound 112 is substantially free from crack initiations, cracking, delamination or other separation from the sidewalls 124 of the dies 106, 126 (and/or overmold compound 128, when present). With less potential for crack initiations, cracking, delamination or other separation from the sidewalls 124 of the dies 106, 126, such defects are significantly less likely to propagate into the RDL layer 102 where one or more of the routings 204 may be compromised, leading to reduced performance and even failure of the chip package assembly 100.

Figure 9I:
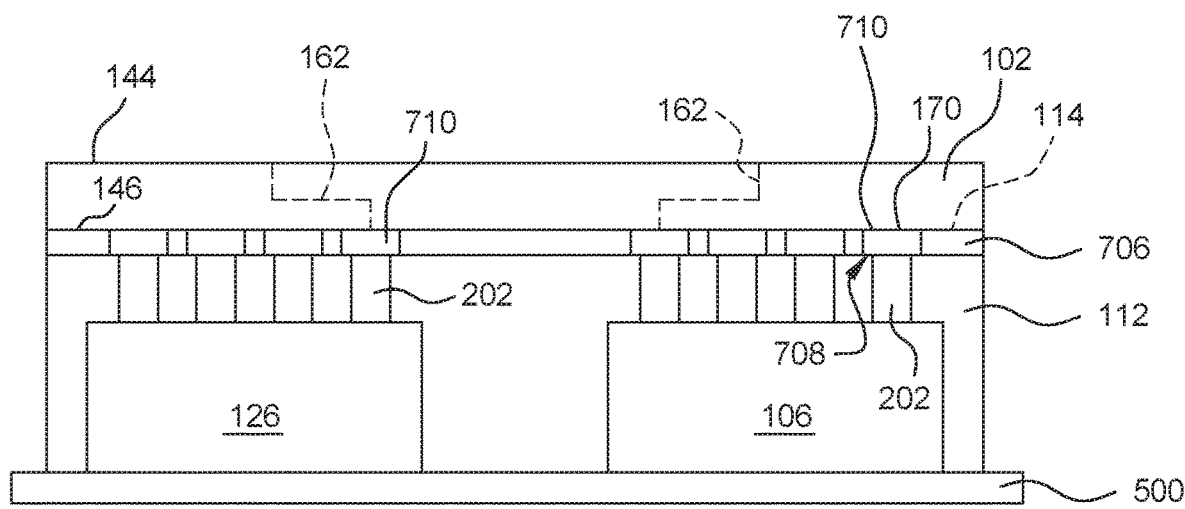

At operation 818, the RDL layer 102 is fabricated directly on the bottom surface 114 of the mold compound 112 without use of solder connections, as shown in FIG. 9I. The RDL layer 102 is fabricated by depositing at least 3 or more dielectric layers in which metal routings 204 are formed. The metal routings 204 may be in the form of interconnected metal lines 206 and vias 208 that form the circuitry 162 of the redistribution layer 102. By forming the RDL layer 102 is fabricated directly on the bottom surface 114 of the mold compound 112 without use of solder connections, higher pitch densities for electric interfaces with the dies 106, 126 may be realized.

At operation 820, the carrier 900 is removed and the RDL layer 102 is electrically and mechanically connected to the interposer substrate 104 utilizing solder connects 118, as shown in FIG. 7G. At operation 820, the package substrate 108 is also electrically and mechanically connected to the interposer substrate 104 utilizing solder connects 118 to complete the fabrication of a chip package assembly 700. As stated above, the chip package assembly 700 is essentially the same as the chip package assembly 100, except for the lack of posts 110 and the configuration of how the contact pads 202 and conductive material 710 make the connection between the circuitry 160 of the IC dies 106, 126 and the circuitry 162 of the RDL layer 102. The fabrication of chip package assembly 700 may include other steps and components.

Thus, a chip package assembly and method for fabricating the same have been provided which utilize a plurality of posts disposed around integrated circuit (IC) dies and grinder-less processes that enhance the resistance of the mold compound and other polymer layers adjacent to the redistribution layer to cracking and/or delamination. The enhanced resistance to cracking and/or delamination greatly improves the prevention of crack propagation into the fanout of the redistribution layer which would cause damage or breakage of conductors within the redistribution layer circuitry. Consequently, reliability and performance of the chip packages assembly is significantly improved.

In addition to the claims below, the disclosed technology may be described in the following non-limiting examples. Example 1 utilizes grinding of the mold compound in a manner that advantageously reduce the probability of crack initiation in the mold compound to take advantage of cost savings associated with the grinding process. Examples 2-3 utilize techniques that advantageously eliminate grinding of the mold compound to reduce the probability of crack initiation in the mold compound.

Example 1: A method for fabricating a chip package assembly includes: attaching IC dies to a carrier, disposing mold compound around the IC dies, forming holes are in the mold compound between the IC dies, filling the holes with a stiffening material to form the posts, removing a portion of the mold compound and ends of the posts to make a bottom surface of the mold compound, die contact pads and bottom surfaces of the posts coplanar, fabricating a redistribution layer directly on the bottom surface of the mold compound without use of solder connections, and removing the carrier, electrically and mechanically connecting the redistribution layer to the interposer substrate utilizing solder connects, and electrically and mechanically connecting the package substrate to the interposer substrate utilizing solder connects.

Example 2: A method for fabricating a chip package assembly includes: attaching IC dies to a carrier, disposing a mold compound around the dies and in contact with the carrier, selectively etching an initial surface of the mold compound relative to contact pads (i.e., pillars) extending from the IC dies, depositing and patterning a polymer layer on the mold compound to form a recess exposing the contact pads, filling the recess with a conductive material and making the conductive material coplanar with the mold compound, fabricating a redistribution layer directly on the mold compound without use of solder connections, removing the carrier, and electrically and mechanically connecting the redistribution layer to the interposer substrate utilizing solder connects, and electrically and mechanically connecting the package substrate to the interposer substrate utilizing solder connects.

Example 3: A method for fabricating a chip package assembly includes: attaching IC dies to a carrier, disposing a mold compound around the dies and in contact with the carrier, selectively etching the initial surface of the mold compound relative to contact pads (i.e., pillars) extending from the IC dies, depositing a resist layer on the mold compound, removing a top portion of the resist layer to make an exposed surface of the resist layer coplanar with the distal ends of the contact pads, removing the remaining resist layer, depositing and patterning a polymer layer on the mold compound to form a recess, filling the recess with a conductive material and making the conductive material coplanar with the mold compound, fabricating a redistribution layer directly on the mold compound without use of solder connections, removing the carrier, electrically and mechanically connecting the redistribution layer to the interposer substrate utilizing solder connects, and electrically and mechanically connecting the package substrate to the interposer substrate utilizing solder connects.

Example 4: A chip package assembly includes a first integrated circuit (IC) die; a substrate; a redistribution layer having circuitry providing electrical connection between circuitry of the first IC die and circuitry of the substrate; a mold compound disposed in contact with the first IC die and spaced from the substrate by the redistribution layer; a plurality of contact pad extending from the first die and having ends exposed in a recess formed in the mold compound; and a conductive material disposed in the recess and electrically coupling the circuitry of the substrate to the circuitry of the redistribution layer.

Example 5: A chip package assembly includes a first integrated circuit (IC) die; a substrate; a redistribution layer having circuitry providing electrical connection between circuitry of the first IC die and circuitry of the substrate; a mold compound disposed in contact with the first IC die and spaced from the substrate by the redistribution layer; a dielectric layer disposed between the mold compound and the redistribution layer; a plurality of contact pad extending from the first die and having ends exposed in a recess formed in the dielectric layer; and a conductive material disposed in the recess and electrically coupling the circuitry of the substrate to the circuitry of the redistribution layer.

Advantageously, the methods of at least Examples 2 and 3 can also be used to increase the pillar (i.e., contact pad) height and remold thereby increasing the mold compound buffer between the bottom surface of the IC die and top surface of the RDL layer. This method can also be used to increase the pillar size to accommodate obtaining IC dies from different third party suppliers who cannot or will not provide uniform pillar size.

While the foregoing is directed to embodiments of the present invention, other and further embodiments of the invention may be devised without departing from the basic scope thereof, and the scope thereof is determined by the claims that follow.

What is claimed is:

1. A chip package assembly comprising:
   a first integrated circuit (IC) die;
   a substrate;
   a redistribution layer having a top surface and a bottom surface opposite the top surface, the redistribution layer providing electrical connection between circuitry of the first IC die and circuitry of the substrate without intervening solder connections disposed between the redistribution layer and the first IC die;
   a mold compound disposed in contact with the first IC die and spaced from the substrate by the redistribution layer; and
   a plurality of posts disposed in the mold compound and laterally spaced from the first IC die, each post of the plurality of posts having a geometry elongated in a direction perpendicular to a top surface of the first IC die, wherein an outer cylindrical surface of each post of the plurality of post is surrounded by and in contact with the mold compound, the plurality of posts not electrically connected to the circuitry of the first IC die, the circuitry of the redistribution layer, or circuitry of the substrate comprising the chip package assembly, wherein a bottom surface of the plurality of posts and a bottom surface of the mold compound contact a dielectric layer of the redistribution layer, wherein a top surface of the plurality of posts is coplanar with a bottom surface of the first IC die, and wherein the plurality of posts are electrically floating relative to ground.

2. The chip package assembly of claim 1, wherein the bottom surface of the plurality of posts and the bottom surface of the mold compound are coplanar.

3. The chip package assembly of claim 1, wherein the plurality of posts are fabricated from a metal containing material.

4. The chip package assembly of claim 1 further comprising:
   a second IC die disposed in contact with mold compound and laterally spaced from the first IC die, the second IC die spaced from the substrate by the redistribution layer, wherein at least some of the plurality of posts are disposed between the first IC die and the second IC die.

5. The chip package assembly of claim 4, wherein at least some of the plurality of posts are disposed on a side the first IC die that is opposite the second IC die.

6. The chip package assembly of claim 1, wherein the first IC die includes a contact pad, and wherein a top surface of the contact pad is coplanar with a top surface of the plurality of posts.

7. The chip package assembly of claim 6, wherein a bottom surface of the contact pad is coplanar with the bottom surface of the mold compound.

8. The chip package assembly of claim 1, wherein the bottom surface of the plurality of posts and the bottom surface of the mold compound form a coplanar ground surface.

9. The chip package assembly of claim 8, wherein the plurality of posts are fabricated from at least one layer comprising a metal containing material.

10. The chip package assembly of claim 9, wherein at least one layer of the metal containing material is a copper seed layer.

11. The chip package assembly of claim 10, wherein at least one layer of the metal containing material is copper plated on the copper seed layer.

12. The chip package assembly of claim 8, wherein the plurality of posts extend beyond a bottom surface of the first IC die.

13. The chip package assembly of claim 1, wherein a top surface of the mold compound is coplanar with the top surface of the first IC die, a bottom surface of the mold compound extending below a bottom surface of the first IC die; and
   each post has a major axis substantially perpendicular to the bottom surface of the first IC die, the surface of each post being substantially parallel to the major axis.

14. The chip package assembly of claim 1, wherein the outer cylindrical surface of the post plurality of posts are not connected to one another within the mold compound.

15. The chip package assembly of claim 1, wherein the top surface of the post plurality of posts are below a bottom surface of the first IC die.

16. A chip package assembly comprising:
   a substrate;
   a redistribution layer having circuitry electrically coupled to circuitry of the substrate via solder connections;
   a first integrated circuit (IC) die;
   a second integrated circuit (IC) die;
   a mold compound disposed in contact with the first IC die and the second IC die, the mold compound spaced from the substrate by the redistribution layer, a bottom surface of the mold compound extending below a bottom surface of the first IC die and the second IC die; and
   a first plurality of posts disposed in the mold compound between the first IC die and the second IC die, the first plurality of posts are not electrically connected to the circuitry of the first IC die, the circuitry of the second IC die, the circuitry of the redistribution layer, or circuitry of the substrate comprising the chip package assembly, and the first plurality of posts are spaced from the substrate by the redistribution layer, each post of the first plurality of posts having a cylindrical geometry elongated in a direction perpendicular to a top surface of the first IC die, wherein a bottom surface of the plurality of posts and a bottom surface of the mold compound form a coplanar ground surface, the redistribution layer formed on coplanar ground surface without intervening solder connections disposed between the redistribution layer and the first IC die, wherein a top surface of the plurality of posts is coplanar with a bottom surface of the first IC die, and wherein the plurality of posts are electrically floating relative to ground.

17. The chip package assembly of claim 16, wherein a top surface of the mold compound is coplanar with the top surface of the first IC die and/or a top surface of the second IC die.

18. The chip package assembly of claim 16, wherein the first plurality of posts are fabricated from a metal containing material.

19. The chip package assembly of claim 16 further comprising:

a second plurality of posts disposed on a side the first IC die that is opposite the second IC die.

20. The chip package assembly of claim 16 further comprising:
    memory dies stacked on the second IC die, wherein the first IC die is configured as a logic die.

21. The chip package assembly of claim 16, wherein an outer cylindrical surface of the post plurality of posts are not connected to one another within the mold compound.

22. The chip package assembly of claim 16, wherein the top surface of the post plurality of posts are below the bottom surface of the first IC die.

* * * * *